United States Patent
Zou et al.

(10) Patent No.: US 11,239,545 B2
(45) Date of Patent: Feb. 1, 2022

(54) MULTIPLE CO-FREQUENCY MICROWAVES DETECTION ANTENNA, MANUFACTURE METHOD THEREOF AND DETECTION METHOD THEREOF

(71) Applicant: Gaodi Zou, Shenzhen (CN)

(72) Inventors: Gaodi Zou, Shenzhen (CN); Xin Zou, Shenzhen (CN)

(73) Assignee: Gaodi Zou, Shenzhen (CN)

( * ) Notice: Subject to any disclaimer, the term of this patent is extended or adjusted under 35 U.S.C. 154(b) by 401 days.

(21) Appl. No.: 16/273,169

(22) Filed: Feb. 12, 2019

(65) Prior Publication Data
US 2020/0203811 A1    Jun. 25, 2020

(30) Foreign Application Priority Data
Dec. 21, 2018 (CN) .......................... 201811571105.7

(51) Int. Cl.
  *H01Q 1/24* (2006.01)
  *G01R 29/08* (2006.01)
  *G01S 13/50* (2006.01)
  *H01Q 15/14* (2006.01)

(52) U.S. Cl.
  CPC ......... *H01Q 1/247* (2013.01); *G01R 29/0878* (2013.01); *G01S 13/505* (2013.01); *H01Q 15/145* (2013.01)

(58) Field of Classification Search
None
See application file for complete search history.

(56) References Cited

U.S. PATENT DOCUMENTS

| | | | |
|---|---|---|---|
| 2010/0168727 A1* | 7/2010 | Hancock | A61B 18/1815 606/33 |
| 2013/0307754 A1* | 11/2013 | Williams | H01Q 21/0087 343/912 |
| 2015/0236403 A1* | 8/2015 | Cheng | H01Q 9/0407 343/700 MS |
| 2018/0081030 A1* | 3/2018 | McMahon | A61B 5/11 |
| 2018/0254555 A1* | 9/2018 | Sotoma | H01Q 25/00 |

* cited by examiner

*Primary Examiner* — Whitney Moore
(74) *Attorney, Agent, or Firm* — Raymond Y. Chan; David and Raymond Patent Firm

(57) ABSTRACT

A multiple co-frequency microwaves detection antenna includes an oscillation circuit unit, a reference ground and at least two radiation sources. The radiation sources each has a feed point and are arranged spacedly at the reference ground. A radiation gap is formed between each of the radiation sources and the reference ground. The feed point of the radiation source is electrically connected to the oscillating circuit unit.

3 Claims, 22 Drawing Sheets

MULTIPLE CO-FREQUENCY MICROWAVES DETECTION ANTENNA, MANUFACTURE METHOD THEREOF AND DETECTION METHOD THEREOF

CROSS REFERENCE OF RELATED APPLICATION

This is a non-provisional application that claims the benefit of priority under 35 U.S.C. § 119 to a China application number 201811571105.7, filed Dec. 21, 2018, wherein the entire content of which is expressly incorporated herein by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to microwaves antennas, and more particularly to a multiple co-frequency microwaves detection antenna, manufacture method thereof and detection method thereof.

Description of Related Arts

In recent years, with the development of microwave technology, more and more products using microwave technology have appeared on the market, such as microwave detectors. A common microwave detector can generate microwaves and receive the reflected microwave signals, and use the Doppler Effect to detect whether there is a moving object in a target area. The microwave detector has high sensitivity to a motion of the objects that reflect microwaves. And the microwave signals generated by the microwave detector are not affected by factors such as ambient temperature and humidity, and have higher reliability than the infrared detectors. Therefore, the microwave detectors are widely used in industrial production and in our daily lives, such as speed measurement for vehicle, automatic doors of supermarket, automatic lights, automatic washing and so on.

The current microwave detector uses an antenna to emit a microwave with a predetermined frequency to detect a motion state of an object within the target area. When a stationary object is encountered, the frequency of the reflected microwave received by the antenna is not change. When the microwave emitted by the antenna encounters a moving object, the frequency of the microwave received by the antenna is changed, so as to calculate the motion state of the object according to the change of the frequency, such as specific location of the object, speed of movement, and direction of movement. However, the conventional microwave detector still has many problems in the application of detecting the motion state of the object in the target area.

Firstly, an area to which the microwave generated by the microwave detector radiates is fixed. That is, a detection area of the microwave detector is limited. And, it is difficult to comprehensively detect the motion state of the object in the target area by using only one of the antennas, thereby affecting the accuracy of detection result.

Secondly, although the detection area of the microwave detector can be enlarged by two or more microwave detectors. That is, the detection area is enlarged by increasing the number of microwave detectors and distributing the plurality of microwave detectors at different positions, so as to comprehensively detect the target area. For example, the plurality of microwave detectors are arranged to cover different detection spaces in a spaces in a layered, inter-partition, and angle-by-angle manner, so as to realize detection for the detection space in the layered, inter-partition, and angle-by-angle manner, thereby acquiring the position and distribution of the moving object in the detection space, and calculating the moving trajectory, moving direction and moving speed of the moving object, so as to realize the trajectory prediction, behavioral purpose judgment and state judgment of the moving object. However, it is necessary to calculate the frequency changes between the microwaves generated and the microwaves received by the plurality of microwave detectors to determine the motion state of the objects in the target area. The more the number of microwave detectors, the more complicated the calculated data and the algorithm are. And the complex signal transmission and connection are necessary, and the additional information processing centers are needed to configure which increase the costs and is difficult to accurately obtain the motion state of the object within the target area.

In addition, according to the conventional art, the microwave detectors disposed in different regions have independent circuits respectively, and the circuits of different microwave detectors are connected to external circuits through wires. The varying magnetic fields are generated by varying electric fields, and the varying magnetic fields in turn produce the varying electric fields, such that the varying electric fields and the varying magnetic fields are interdependent and excited mutually. And, the varying electric fields and the varying magnetic fields are alternately generated to generate the microwaves, and the antennas radiate microwaves outward. However, due to the difference in parameters of the electrical components in different circuits, the frequencies of the microwaves radiated by the microwave detectors are difficult to achieve uniformity and synchronization. When the different microwave detectors detect the same target area, on the one hand, the microwaves radiated by the different microwave detectors will interfere with each other. On the other hand, when the detection areas of the microwaves radiated by the different microwave detectors are overlapped, in the overlapped area, each microwave radiated by the different microwave detectors is difficult to be coincident. That is, there may be a situation where the microwave radiated by one of the antennas is at a wave crest, and the microwave radiated by another antenna is in a wave trough, even of the frequencies are coincident In the subsequent calculation process, a cumbersome algorithm is needed to solve the relevant parameters of the frequencies of the received microwaves, such as to calculate parameters of a frequency difference between the different microwaves received. In this way, the difficulty of obtaining the moving state of the object in the target area is further increased. Moreover, in the current stage, it is difficult for a person skilled in the art to obtain an accurate algorithm, and a complicated calculation logic causes the calculation time of the microwave detector to be long, so that it is delayed to acquire the time of the motion state of the object in the target area, thereby affecting the accuracy of the microwave detector in detecting the motion state of the object within the target area.

Therefore, the increase in the number of microwave detectors inevitably increases the costs and the complexity of connecting multiple microwave detectors into one system. And at the same time, mutual interference occurs between the microwave detectors which are distributed to cover the same area. When the microwave detectors that are centrally installed are in operation, the microwave beams radiated by microwave detectors may interfere with each other in addition to the auxiliary lobes other than the main lobes (such as the side lobes and the back lobes) so that the microwave detectors can not work normally.

SUMMARY OF THE PRESENT INVENTION

An object of the present invention is to provide a multiple co-frequency microwaves detection antenna, manufacture method thereof and detection method thereof, wherein the multiple co-frequency microwaves detection antenna comprises at least two radiation sources electrically connected to a same oscillation circuit unit, so that the different radiation sources are capable of radiating microwaves outward with the same frequency, so that the multiple co-frequency microwaves detection antenna simultaneously generates the plurality of microwaves having the same frequency and capable of independently detecting or detecting by combining.

Another object of the present invention is to provide a multiple co-frequency microwaves detection antenna, manufacture method thereof and detection method thereof, wherein the multiple co-frequency microwaves detection antenna covers a target area by a detecting area formed the plurality of microwaves with the same frequencies and detects the target area to obtain a motion state of a target object in the target area.

Another object of the present invention is to provide a multiple co-frequency microwaves detection antenna, manufacture method thereof and detection method thereof, wherein the multiple co-frequency microwaves detection antenna simultaneously detects the plurality of target areas by multiple microwaves having the same phases, so as to improve a detection efficiency of the multiple co-frequency microwaves detection antenna and to expand the detection area of the multiple co-frequency microwaves detection antenna.

Another object of the present invention is to provide a multiple co-frequency microwaves detection antenna, manufacture method thereof and detection method thereof, wherein the multiple co-frequency microwaves detection antenna can simultaneously transmit a plurality of microwave having the same frequency to avoid mutual interference while each microwave is transmitted and received, thereby more reliably acquiring the motion state of the target object in the target area.

Another object of the present invention is to provide a multiple co-frequency microwaves detection antenna, manufacture method thereof and detection method thereof, wherein the multiple co-frequency microwaves detection antenna outwardly radiates the independent microwaves with the same frequencies, so that when calculating the motion state of the target object, the frequency parameters of the different microwaves are unified, thereby facilitating the simplification of the correlation algorithm for acquiring the position and distribution of the target object.

Another object of the present invention is to provide a multiple co-frequency microwaves detection antenna, manufacture method thereof and detection method thereof, wherein the detection area formed by the microwaves can be dynamically adjusted, thereby more accurately determining the motion state of the target object within the target area, by a manner of changing the detection area formed by the microwaves.

Another object of the present invention is to provide a multiple co-frequency microwaves detection antenna, manufacture method thereof and detection method thereof, wherein the detection area formed by the co-frequency microwaves can be dynamically adjusted, so that the multiple co-frequency microwaves detection antenna can obtain the position and distribution of the target object in the target area, and calculates the motion state of the moving object such as moving track, moving direction, and moving speed.

Another object of the present invention is to provide a multiple co-frequency microwaves detection antenna, manufacture method thereof and detection method thereof, wherein the multiple co-frequency microwaves detection antenna can obtain the motion state of the moving object in the target area to predict a motion purpose of the target object according to the detected motion state of the target object, thereby realizing analysis and judgment of the human body posture and prediction of the behavior purpose when the target object is a human body.

Another object of the present invention is to provide a multiple co-frequency microwaves detection antenna, manufacture method thereof and detection method thereof, wherein a radiation direction and radiation angle of the microwave can be changed, so that the detection area formed by the microwaves is dynamically adjusted.

Another object of the present invention is to provide a multiple co-frequency microwaves detection antenna, manufacture method thereof and detection method thereof, wherein a position of at least one of the radiation sources relative to the other radiation sources can be adjusted, thereby changing a radiation direction of the microwave source radiated outward by the radiation source.

Another object of the present invention is to provide a multiple co-frequency microwaves detection antenna, manufacture method thereof and detection method thereof, wherein the multiple co-frequency microwaves detection antenna provides a reference ground, and the radiation sources are spacedly disposed at the reference ground, wherein an orientation of the radiation source is changed by changing an extension direction of the reference ground, thereby changing the radiation direction of the microwave radiated outward by the radiation source.

Another object of the present invention is to provide a multiple co-frequency microwaves detection antenna, manufacture method thereof and detection method thereof, wherein the multiple co-frequency microwaves detection antenna provides a substrate, and the reference ground is disposed on the substrate, wherein a deformation of the substrate changes the extension direction of the reference ground at the same time, thereby changing the radiation direction of the microwave generated by the radiation source held on one side of the reference ground.

Another object of the present invention is to provide a multiple co-frequency microwaves detection antenna, manufacture method thereof and detection method thereof, wherein the reference ground comprises at least two reference ground bodies corresponding to the number of radiation sources, wherein the reference ground body is disposed on the substrate, and an extension direction of the reference ground body is changed by adjusting a direction in which the substrate extends to change the orientation of the radiation source.

Another object of the present invention is to provide a multiple co-frequency microwaves detection antenna, manufacture method thereof and detection method thereof, wherein the multiple co-frequency microwaves detection antenna further comprises a reflector, wherein the reflector is movably held at the reference ground corresponding to the radiation source at one side of the radiation source, so that the radiation direction and the radiation angle of the microwave radiated outward by the radiation source are able to being adjusted by changing a relative angle between a reflective surface of the reflector and the radiation source.

Another object of the present invention is to provide a multiple co-frequency microwaves detection antenna, manufacture method thereof and detection method thereof, wherein the position of at least one of the radiation sources relative to said other radiation source is changed by the reflector and the substrate to adjust a radiation area of the microwaves generated by the multiple co-frequency microwaves detection antenna.

Another object of the present invention is to provide a multiple co-frequency microwaves detection antenna, manufacture method thereof and detection method thereof, wherein the multiple co-frequency microwaves detection antenna comprises a mixer and detector circuit, wherein the mixer and detector circuit is connected with the radiation source and an oscillation circuit unit, wherein the mixer and detector circuit receives electrical signals respectively generated by the microwaves emitted and an echo received by the corresponding radiation sources, and determines the motion state of the object in the target area detected by the multiple co-frequency microwaves detection antenna according to the change of the electrical signal.

Additional advantages and features of the invention will become apparent from the description which follows, and may be realized by means of the instrumentalities and combinations particular point out in the appended claims.

According to the present invention, the foregoing and other objects and advantages are attained by a multiple co-frequency microwaves detection antenna having an oscillation circuit unit comprising a reference ground and at least two radiation sources, each having a feed point, wherein the radiation sources are spacedly arranged at the reference ground, and a radiation gap is formed between each of the radiation sources and the reference ground, wherein the feed points of said radiation sources are electrically connected to the oscillation circuit unit.

According to an embodiment of the present invention, the multiple co-frequency microwaves detection antenna further comprises a substrate, wherein the reference ground is arranged at one side of the substrate, wherein the substrate is capable of being deformed and changing an extension of the reference ground.

According to one embodiment of the present invention, the substrate is a flexible deformable PCB board.

According to one embodiment of the present invention, the reference ground comprises at least two reference ground bodies corresponding to a number of the radiation sources, wherein the radiation sources are spacedly arranged at the reference ground bodies, wherein the radiation gap is formed between each of the radiation sources and the corresponding reference ground body, wherein the reference ground bodies are disposed at the substrate, wherein an extension direction of the reference ground is capable of being changed by deformation of the substrate.

According to one embodiment of the present invention, the multiple co-frequency microwaves detection antenna further comprises at least two shields corresponding to a number of the reference ground bodies, wherein the shield and the reference ground body are respectively held at two sides of the substrate to ensure that the portion of the reference ground body corresponding to the radiation source is always maintained in a plane and is always flat.

According to one embodiment of the present invention, the shield and the reference ground body are held on the same side of the substrate to ensure that the portion of the reference ground body corresponding to the radiation source is always maintained in a plane and is always flat.

According to one embodiment of the present invention, the reference ground bodies are electrically connected to each other.

According to one embodiment of the present invention, the reference ground bodies are integrally formed as an integral conductive metal layer.

According to one embodiment of the present invention, the substrate comprises a first substrate and a plurality of second substrates, wherein the plurality of second substrates are arranged to extend from the first substrate at intervals, wherein at least one of the reference ground bodies is disposed on the first substrate, wherein at least one of the reference ground bodies is disposed on the second substrates, wherein an angle between the first substrate and each of the second substrates can be adjusted.

According to one embodiment of the present invention, the multiple co-frequency microwaves detection antenna further comprises a substrate and a flexible connector, wherein the substrate comprises a first substrate and a plurality of second substrates, wherein the reference ground comprises at least two reference ground bodies corresponding to a number of the radiation sources, wherein at least one of the reference ground bodies is disposed on the first substrate, and at least one of the reference ground bodies is disposed on the second substrate, wherein two ends of the flexible connector are respectively connected to the first substrate and the second substrate, and the flexible connector is respectively electrically connected to the reference ground body corresponding to the first substrate and the reference ground body corresponding to the second substrate, wherein when the flexible connector is deformed, an extension direction of the first substrate or the second substrate connected to the flexible connector is changed.

According to one embodiment of the present invention, the first substrate is a PCB board, and each of the plurality of second substrates is a flexible deformable PCB board.

According to one embodiment of the present invention, the first substrate and the plurality of second substrates are flexible deformable PCB boards.

According to one embodiment of the present invention, the multiple co-frequency microwaves detection antenna further comprises a reflector, wherein the reflector has a reflective surface, wherein the reflector is arranged at the reference ground, wherein an angle is formed between the reflective surface of the reflector and the radiation source, and the reflective surface of the reflector is capable of changing a radiation direction of the microwave generated by the radiation source.

According to one embodiment of the present invention, the reflector is movably disposed at the reference ground.

According to one embodiment of the present invention, a length of the reflector is greater than or equal to a length of a long side of the radiation source.

According to one embodiment of the present invention, a width of the reflector is a parameter γ, and the value of the parameter γ ranges: $\frac{1}{16}\lambda \leq \gamma \leq \lambda$.

According to one embodiment of the present invention, the reflector is made of metal.

According to one embodiment of the present invention, the multiple co-frequency microwaves detection antenna further comprises at least a mixer and detector circuit, wherein both ends of the mixer and detector circuit are electrically connected to the oscillation circuit unit and the feeding point of the radiation source respectively.

According to one embodiment of the present invention, one end of each of the mixer and detector circuits is electrically connected to the feed point of one of the radiation sources, and the other end of each of the mixer and detector circuits is electrically connected to the oscillation circuit unit.

According to one embodiment of the present invention, one end of each of the mixer and detector circuits is electrically connected to the feeding points of at least two of said radiation sources, and the other end of each of the mixer and detector circuits is electrically connected to the oscillation circuit unit.

According to one embodiment of the present invention, the radiation sources of the multiple co-frequency microwaves detection antenna are grounded.

According to another aspect of the present invention, the present invention further provides a manufacture method for the multiple co-frequency microwaves detection antenna, comprising the following steps:

(a) maintaining at least two radiation sources at a reference ground in a manner of forming a radiation gap between the at least two radiation sources and the reference ground; and (b) electrically connecting a feed point of the radiation source to an oscillation circuit unit.

According to one embodiment of the present invention, the above manufacture method further comprises a step of arranging the reference ground on a substrate, wherein an extension direction of the reference ground is changed when the substrate is deformed.

According to one embodiment of the present invention, the above manufacture method further comprises a step of arranging a reflector to the reference ground in such a manner that a reflective surface of the reflector is arranged to face the radiation source.

According to one embodiment of the present invention, the above manufacture method further comprises a step of movably arranging the reflector to the reference ground in such a manner that the reflective surface of the reflector is arranged to face the radiation source.

According to one embodiment of the present invention, the above manufacture method further comprises a step of detachably mounting at least a flexible connector on a first substrate of the substrate to connect at least a second substrate of the substrate to the first substrate.

According to another aspect of the present invention, the present invention further provides a detection method for the multiple co-frequency microwaves detection antenna, comprising a step of:

(I) Outwardly radiating a microwave having the same frequency by connecting an oscillation circuit unit with a feed point of at least two radiation sources.

According to one embodiment of the present invention, the detection method further comprises a step of:

(II) Dynamically changing a radiation direction of the microwave.

According to one embodiment of the present invention, the step (II) further comprises a step of:

(III) Changing a position of at least one of the radiation sources relative to the other of the radiation sources in such a manner that a substrate is deformed.

According to one embodiment of the present invention, the step (II) further comprises a step of:

(IV) Reflecting and constraining the microwave by a reflective surface of a reflector to change the radiation angle and the radiation direction of the microwave.

According to one embodiment of the present invention, the step (IV) further comprises a step of changing an angle formed between the reflecting surface of the reflecting member and the radiation source.

According to one embodiment of the present invention, the step (II) further comprises a step of changing a relative position between a first substrate and at least a second substrate in a manner of deforming a flexible connector, thereby adjusting a radiation direction of the microwave radiated by the corresponding radiation source.

According to one embodiment of the present invention, said step (I) further comprises a step of:

(a) Receiving a electrical signal formed by an echo of the microwave generated by at least one of the radiation sources by the at least a mixer and detector circuit.

According to one embodiment of the present invention, in said step (a), each of the mixer and detector circuits receives a electrical signal formed by an echo of microwaves generated by one of the radiation source.

According to one embodiment of the present invention, in said step (a), each of the mixing detection circuits receives the electrical signals formed by the echoes generated by the corresponding two or more radiation source.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1A:
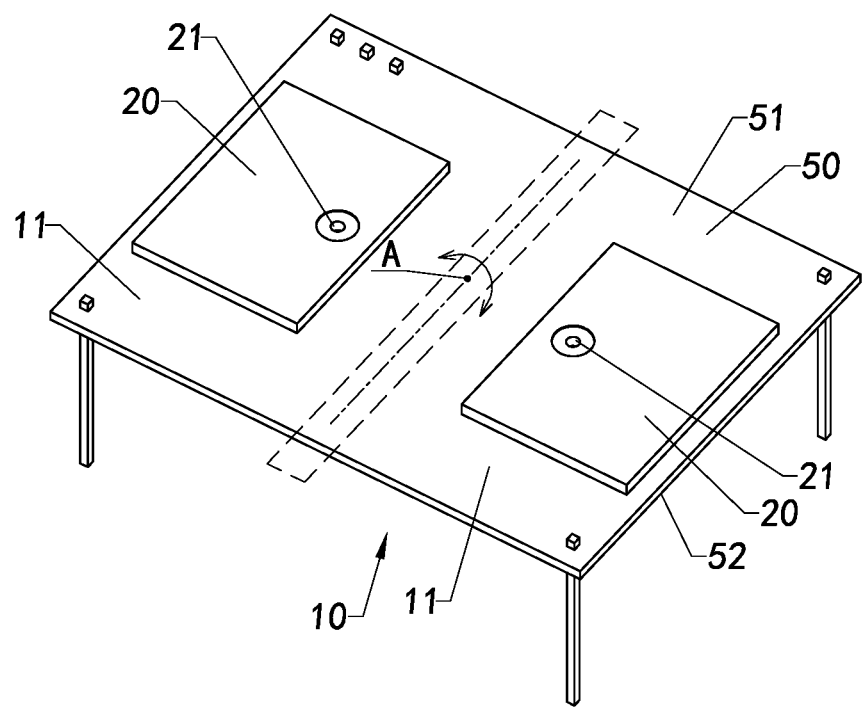
FIG. 1A is a stereogram and schematic view of a multiple co-frequency microwaves detection antenna according to a preferred embodiment of the present invention.
Figure 1B:
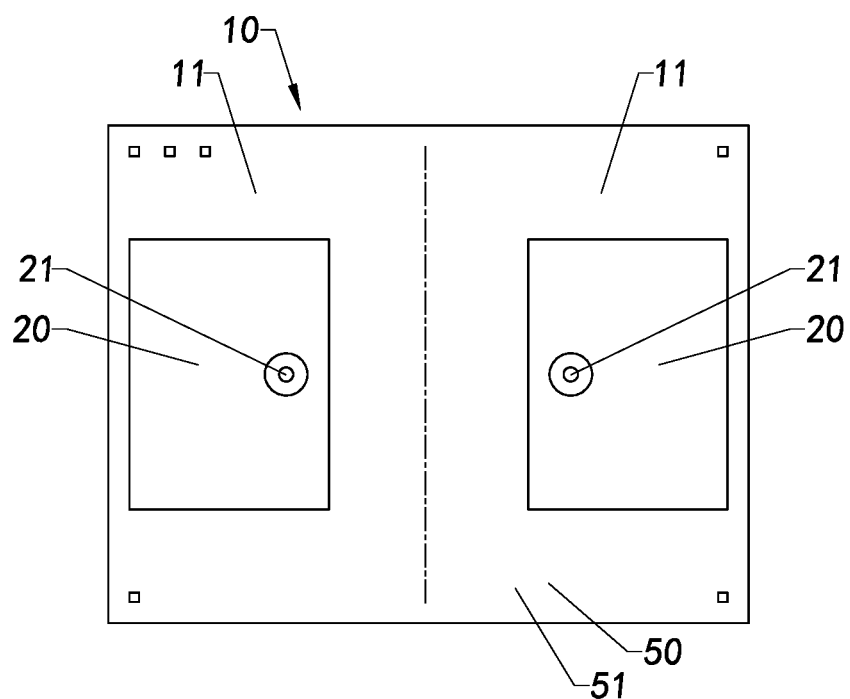
FIG. 1B is a top and schematic view of the multiple co-frequency microwaves detection antenna according to the above preferred embodiment of the present invention.
Figure 2A:
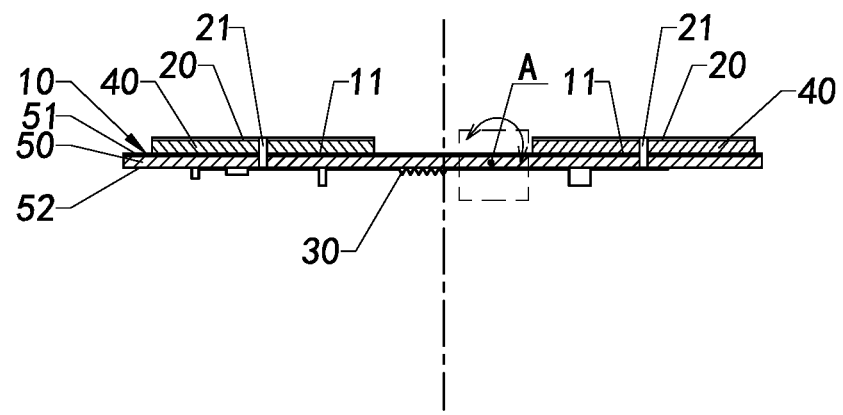
FIG. 2A is a sectional view of the multiple co-frequency microwaves detection antenna according to the above preferred embodiment of the present invention.
Figure 2B:
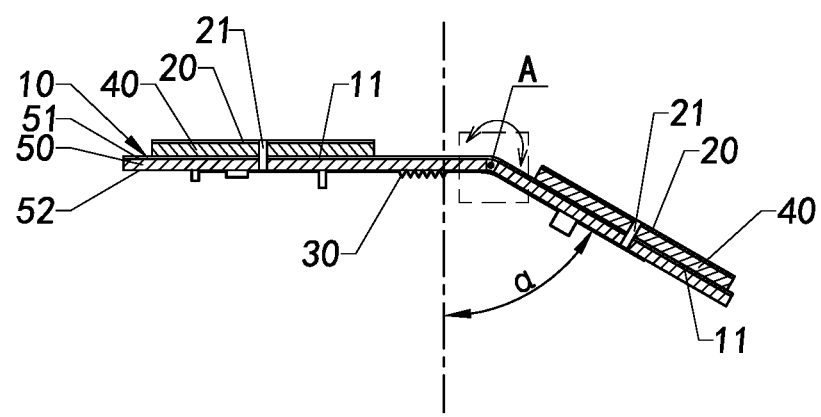
FIG. 2B is a sectional view of the multiple co-frequency microwaves detection antenna according to the above preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and etc. that indicate relations of directions or positions are based on the relations of directions or positions shown in the appended drawings, which are only to facilitate descriptions of the present invention and to simplify the descriptions, rather than to indicate or imply that the referred device or element is limited to the specific direction or to be operated or configured in the specific direction. Therefore, the above-mentioned terminologies shall not be interpreted as confine to the present invention.

Referring to FIG. 1A to FIG. 2B, a multiple co-frequency microwaves detection antenna according to a preferred embodiment of the present invention is described in the following description, wherein the antenna can be applied to detect a target area and obtain a motion information of a target object within the target area. Further, the antenna can outwardly radiate at least two independent microwaves of the same phases. The microwaves form a detection area, and detect a motion state of the target object in the target area by covering the target area with the detection area. Specifically, the microwaves radiated outward by the antenna have a predetermined frequency. The microwaves reach the target area, and when the target object in the target area is in a stationary state, the returned microwaves received by the antenna are still maintained the predetermined frequency. When the target object in the target area is in a motion state, the frequency of the microwaves received by the antenna is changed for subsequently calculating the motion state of the target object in the target area according to relevant datum of the microwaves changing.

Referring to FIG. 1A to FIG. 2B, the antenna comprises a reference ground 10 and at least two radiation sources 20, wherein each of the radiation source 20 has a feed point 21. The radiation sources 20 are spacedly arranged at the reference ground 10, and a radiation gap 40 is formed between each of the radiation sources 20 and the reference ground 10. Further, the antenna has an oscillation circuit unit 30. The feeding point 21 of the radiation source 20 is electrically connected to the oscillation circuit unit 30, wherein the oscillation circuit unit 30 transmits a microwave excitation electrical signal so that the feed point 21 of the radiation source 20 can be accessed to the microwave excitation electrical signal. Further, after the microwave excitation electrical signal is accessed to the radiation source 20 from the feed point 21, the antenna generates the microwave radiated outward at the radiation source 20. The target area can be detected by the microwave, and the motion state of the target object in the target area can be obtained. It is worth mentioning that the feeding points 21 of the different radiation sources 20 are electrically connected to the same oscillation circuit unit 30, so that the microwaves radiated by the different radiation sources 20 have the same frequency. In this way, on the one hand, mutual interferences are avoided, while the different radiation sources 20 transmit the microwave and receive corresponding echoes. On the other hand, when the motion state of the target object is subsequently calculated, the frequency parameters of the different microwaves are unified, thereby facilitating the simplification of the correlation algorithm for acquiring the motion state of the target object, and improving the ability of obtaining the motion state of the target object within the target area of the antenna.

Further, the feed point 21 of the radiation source 20 is deviated from a physical center of the radiation source 20 to reduce an intensity requirement of an excitation current of the microwave excitation electrical signal generated by the radiation source 20 to the oscillation circuit unit 30, so that when the microwave excitation electrical signal generated by the oscillation circuit unit 30 is accessed to the radiation source 20 from the feed point 21 of the radiation source 20, the radiation source 20 is more likely to generate and form an initial polarization direction.

It should be understood by those skilled in the art that in order to obtain mutually independent microwaves having the same frequency, preferably, each of the radiation sources 20 has different working polarization directions. That is, the connection direction of the physical center of each of the radiation sources 20 to the feed points 21 is different. That is, in the description of the present invention, the radiation sources having the same polarization direction, and a radiation sources combination where multiple radiation sources are arranged in an array distribution to satisfy different radiation angles, radiation distances and gain requirements, are considered to be one of the radiation sources 20 in the description of the present invention.

It is worth mentioning that the shape of the radiation source 20 of the antenna is not limited, and the shape of the radiation source 20 can be implemented as, but not limited to, one or more of a combination of a polygon, a circle or an ellipse. In addition, an extension direction of the radiation source 20 of the antenna is also not limited. Although the extension direction of the radiation source 20 shown in the drawings of the present invention is coincided with an extension direction of the reference ground, but in other embodiments of the invention, the radiation source 20 may also be embodied to be perpendicular to the extension direction of the reference ground 10. It will be appreciated by those skilled in the art that the specific embodiment of the radiation source 20 of the antenna is merely exemplary and is not a limitation of the content and scope of the antenna of the present invention.

Referring to FIG. 1A to FIG. 2B, the antenna further comprises a substrate 50, wherein the substrate 50 comprises a first side 51 and a second side 52. The reference ground 10 is held on the first side surface 51 of the substrate 50 in a manner that the reference ground 10 is attached to the circuit base 50. The oscillation circuit unit 30 is disposed on the substrate 50. Preferably, the oscillation circuit unit 30 is embedded between the first side 51 and the second side 52 of the substrate 50. Preferably, the oscillation circuit unit 30 is held on the second side 52 of the substrate 50. The reference ground 10 has good electrical conductivity, and the specific material of the reference ground 10 is not limited. The reference ground 10 may be a metal layer made of a conductive material such as copper or copper alloy. It should be understood that the specific embodiment of the reference ground 10 is not limited.

Further, the direction and the angle of the microwaves generated by the radiation source 20 of the antenna can be dynamically adjusted to dynamically change the detection area formed by the microwaves. On one hand, the detection area of the antenna can be enlarged by dynamically adjusting the radiation direction of the microwave. For example, an overlapped area of the microwaves generated by two of the radiation sources 20 can be reduced by a manner changing the microwaves generated by one of the two radiation sources 20 of the antenna, so that the detection area of the antenna can be enlarged. On the other hand, it can be more accurately in determining the accurate position and the motion state of the target object within the target area by adjusting the radiation direction of the microwave. For example, when it is determined that the target object is located in the overlapped area formed by the two microwaves generated by two of the radiation sources 20, the radiation directions of the microwave generated the two radiation sources 20 of the antenna are changed to reduce the overlapped area of the two microwaves, thereby facilitating more accurate determination of the specific location of the target object within the target area. Moreover, the microwaves generated by the radiation sources 20 of the antenna have the same frequency, thereby simplifying the time for acquiring the motion state of the target object by the microwaves generated by the radiation sources 20, which is beneficial to reducing a response time of the antenna to improve the efficiency and accuracy of acquiring the motion state of the target object.

It is worth mentioning that the microwaves radiated by the radiation sources 20 having different polarization directions, and the reflected corresponding echoes can work independently without interfering with each other. That is, each of the microwaves can independently acquire respective detection results so as to obtain the number of the target objects and the distribution, moving direction, moving speed and the like of each target object.

Specifically, in some specific embodiments of the present invention, referring to FIG. 1A to FIG. 6B, the antenna can change the extension direction of the reference ground 10 disposed on the substrate 50 by the deformation of the substrate 50 to change an orientation of the radiation source 20 and to dynamically adjust the radiation direction of the microwave produced by the radiation source 20. In particular, the reference ground 10 comprises at least two interconnected reference ground bodies 11 corresponding to the number of the radiation sources 20. The radiation sources 20 are spacedly arranged at the corresponding reference ground bodies 11 in a manner that the radiation gap 40 is formed between the radiation source 20 and the corresponding reference ground body 11. The reference ground bodies 11 are disposed on the first side surface 51 of the substrate 50. Preferably, the adjacent reference ground bodies 11 are electrically connected. Preferably, the reference ground bodies 11 are integrally formed as an integral conductive metal layer. Further, the substrate 50 can be deformed, and the reference ground body 11 disposed on the substrate 50 can change an extension direction according to the change of the substrate 50, thereby changing the orientation of the radiation source 20 disposed on the reference ground bodies 11 to dynamically adjust the radiation direction of the microwave generated by the radiation source 20.

Preferably, the substrate 50 has flexibility, and any portion of the substrate 50 can be deformed in a flexible manner such that any one of the reference ground bodies 11 disposed on the substrate 50 is deformed, thereby changing the orientation of at least one of the radiation sources 20 to dynamically adjusting the relative position of at least one radiation source 20 to the other radiation sources 20 to change the radiation direction of at least one microwave produced by the multi-beam detection antenna. For example, when the substrate 50 in a horizontal state is deformed in the flexible manner, and a portion of the substrate 50 is bent downward along a fold line A, the extension direction of the reference ground body 11 corresponding to the downwardly bent portion of the substrate 50 is changed from the horizontal state to an oblique downward direction, and thus the orientation of the radiation source 20 corresponding to the reference ground body 11 is changed. Thereby, the radiation direction of the microwave formed by the antenna is dynamically adjusted by deforming the substrate 50, thereby adjusting the detection area of the multi-beam detection antenna. Preferably, an angle at which one of the reference ground bodies 11 moves downward relative to the other reference ground bodies 11 is a parameter α, and the parameter α is less than or equal to 90°. That is, the angle at which the substrate 50 can be deformed upwardly is less than or equal to 90°, and the angle at which the substrate 50 can be deformed downwardly is less than or equal to 90°.

Preferably, the substrate 50 is implemented as a flexible deformable PCB board, such as an FPC, and the oscillation circuit unit 30 is embedded in the substrate 50.

Figure 3A:
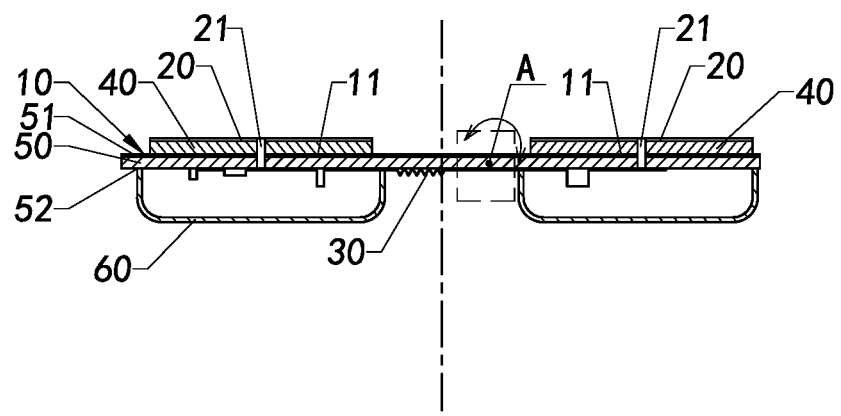
FIG. 3A is a sectional view of a multiple co-frequency microwaves detection antenna according to another preferred embodiment of the present invention.
Figure 3B:
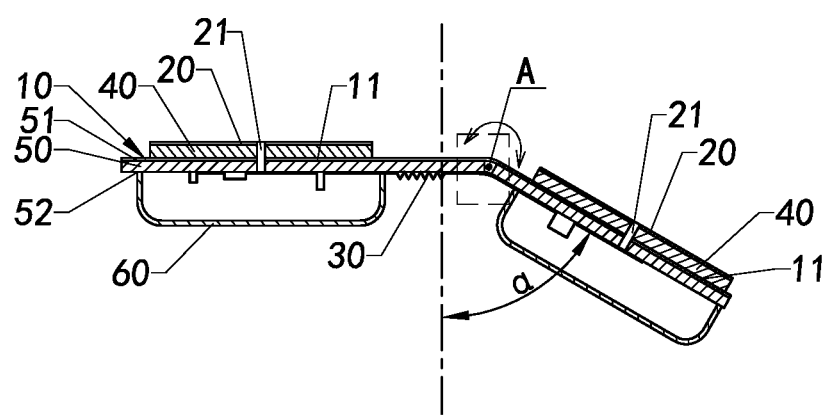
FIG. 3B is a sectional view of the multiple co-frequency microwaves detection antenna according to the above another preferred embodiment of the present invention.

Referring to FIG. 3A and FIG. 3B, in a preferred embodiment of the present invention, the antenna comprises at least one shield 60 corresponding to the number of reference ground bodies 11, and the adjacent shields 60 are spacedly arranged on the second side 52 of the substrate 50. The shield 60 is corresponding to the reference ground body 11 of the reference ground 10. That is, the reference ground body 11 and the shield 60 are respectively held on both sides of the same portion of the substrate 50. The shield 60 can ensure that the portion of the reference ground body 11 corresponding to the radiation source 20 is always held in a plane and is always flat. Specifically, when the substrate 50 is deformed, the shield 60 is not deformed, and the shield 60 makes the portion of the substrate 50 corresponding to the shield 60 being not deformed. So, the portion of the reference ground body 11 corresponding to the shield 60 is always held in the same plane without deformation, which is advantageous in avoiding changes of the reference ground body 11 to interfere with the radiation source 20. In other words, only the portion of the substrate 50 corresponding to the adjacent shield 60 can be deformed, thereby changing the extension direction of the reference body 11 and the radiation direction of the radiation source 20.

It can be understood that the shield 60 and the corresponding reference ground body 11 can also be disposed on the same side of the substrate 50. For example, the shield 60 is disposed on the first side 51 of the substrate 50. And a space and the reference ground body 11 are maintained intervally, wherein the space is corresponding to the second side 52 of the substrate 50 where the radiation source 20 corresponding to the reference ground body 11 is corresponding, so the shield 60 can also be ensured that the portion of the reference ground body 11 corresponding to the radiation source 20 is always held in a plane and is always flat. Therefore, when the substrate 50 is deformed, the shield 60 is not deformed, and the shield 60 causes the substrate 50 not to be deformed corresponding to the position of the shield 60, so that a portion of the substrate 50 corresponding to a portion between the adjacent shield cover 60 can be deformed to change the direction in which the reference body 11 extends to change the radiation direction of the radiation source 20.

In particular, while the shield 60 can maintain that the portion of the reference ground body 11 corresponding to the radiation source 20 is always held in the plane and is always flat, the shield 60 can also reduce the interference of an auxiliary lobe of the radiation source 20 with corresponding microwaves. Thus, in some embodiments of the invention, the shield 60 can also be implemented as a hard sheet to only ensure that the portion of the reference ground body 11 corresponding to the radiation source 20 is always held in the plane and is always flat, so that the radiation direction of the radiation source 20 is changed when the portion of the substrate 50 corresponding to the adjacent shield cover 60 is deformed.

Referring to FIG. 1A to FIG. 3B, for example, the specific number of the radiation sources 20 of the antenna is two, and the specific number of the reference ground bodies 11 is two. The two radiation sources 20 are respectively disposed at the corresponding reference ground bodies 11 at intervals. The two reference ground bodies 11 are held side by side on the first side 51 of the substrate 50. When the substrate 50 is parallel to a horizontal plane, the two reference ground bodies 11 are arranged to extend in the same direction and are in the same plane. When the portion of the substrate 50 corresponding to the adjacent shield cover 60 is deformed, the extension direction of at least one reference ground bodies 11 is changed.

Preferably, one of the two reference ground bodies 11 can be bent up or down relative to the other reference ground body 11 in a manner that the substrate 50 is deformed. In other words, the radiation direction of one of the two radiation sources 20 is changed to change the radiation direction of one microwave generated by the antenna to change the detection area of the antenna. Preferably, the two reference ground bodies 11 are simultaneously moved relative to each other in such a manner that the substrate 50 is deformed, thereby changing the radiation directions of the two microwaves generated by the antenna to change the detection area of the antenna. For example, the two reference ground bodies 11 are in the same plane, that is the angle between the two reference ground bodies is 180°. And, the substrate 50 is deformed such that the angle sandwiched the two reference ground bodies 11 becomes smaller, and thus the two radiation sources 20 are close to each other such that the overlapped area of the microwaves generated by the radiation sources 20 is increased. When the angle between the two reference ground bodies 11 is increased, the two radiation sources 20 are remote from each other, and the overlapped area formed by the microwaves generated by the radiation sources 20 is reduced.

Figure 4A:
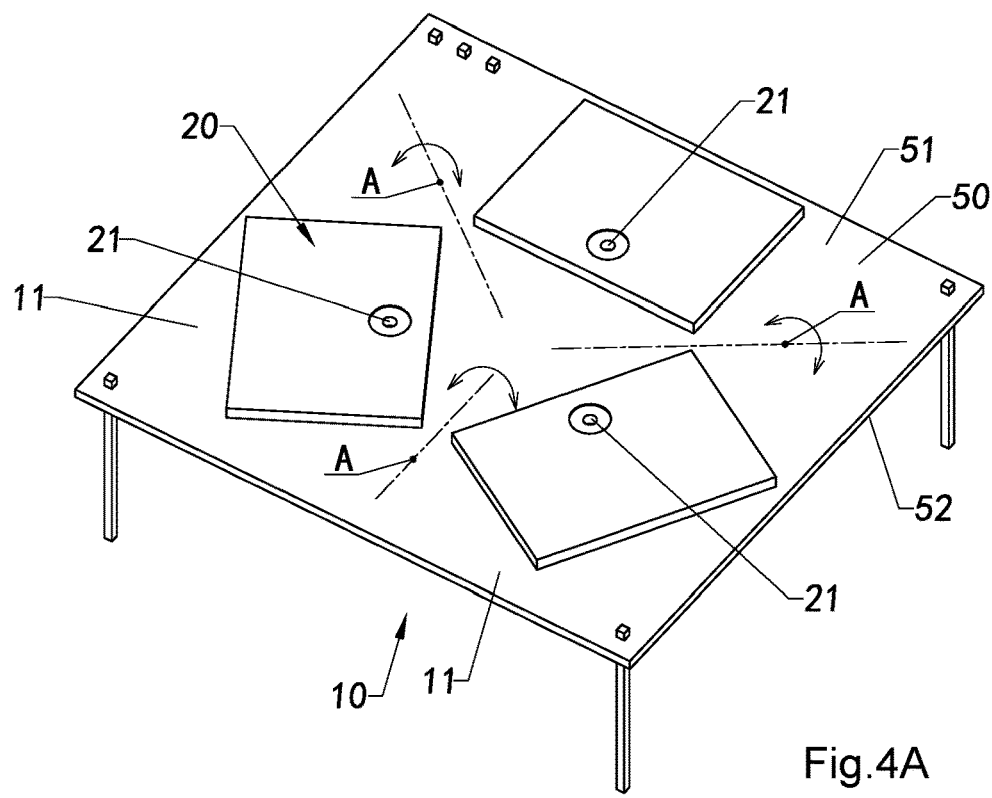
FIG. 4A is a stereogram and schematic view of a multiple co-frequency microwaves detection antenna according to another preferred embodiment of the present invention.
Figure 4B:
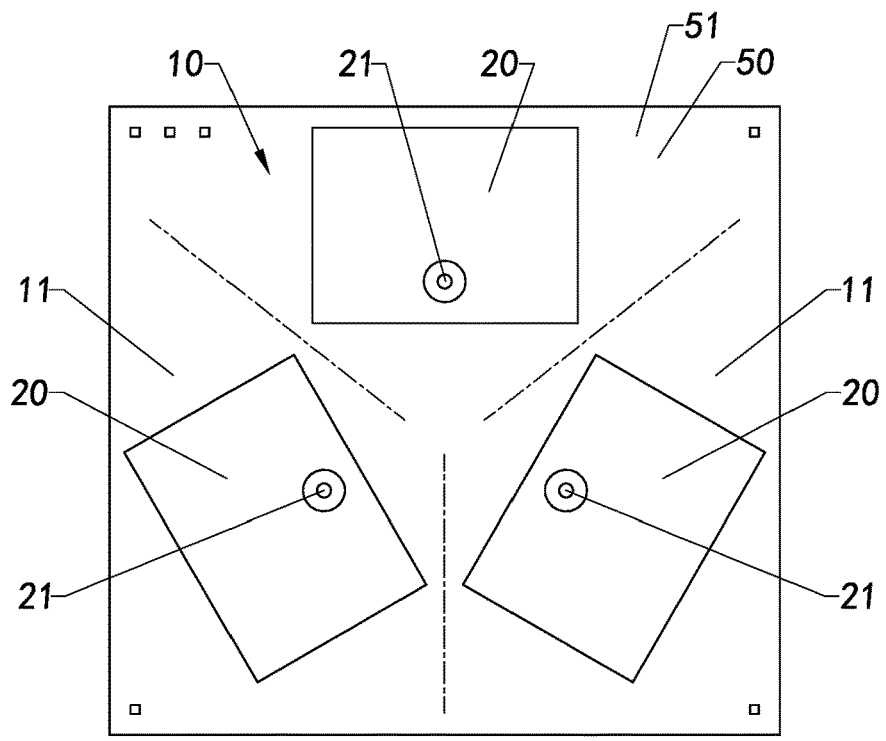
FIG. 4B is a top and schematic view of a multiple co-frequency microwaves detection antenna according to the above preferred embodiment of the present invention.
Figure 5A:
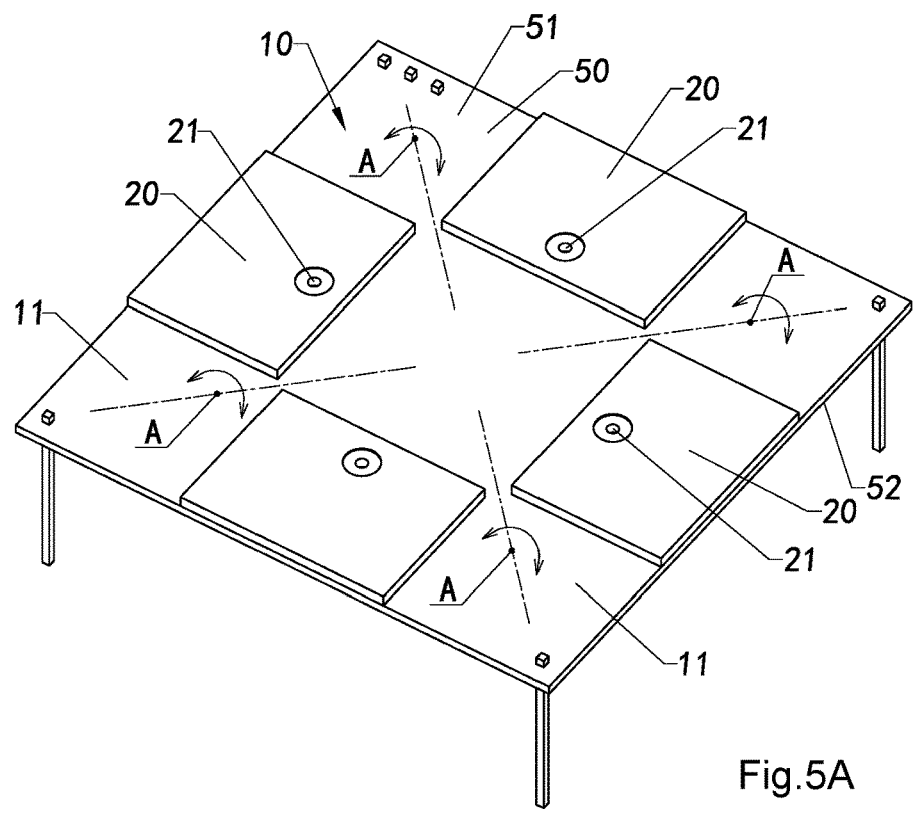
FIG. 5A is a stereogram and schematic view of a multiple co-frequency microwaves detection antenna according to another preferred embodiment of the present invention.
Figure 5B:
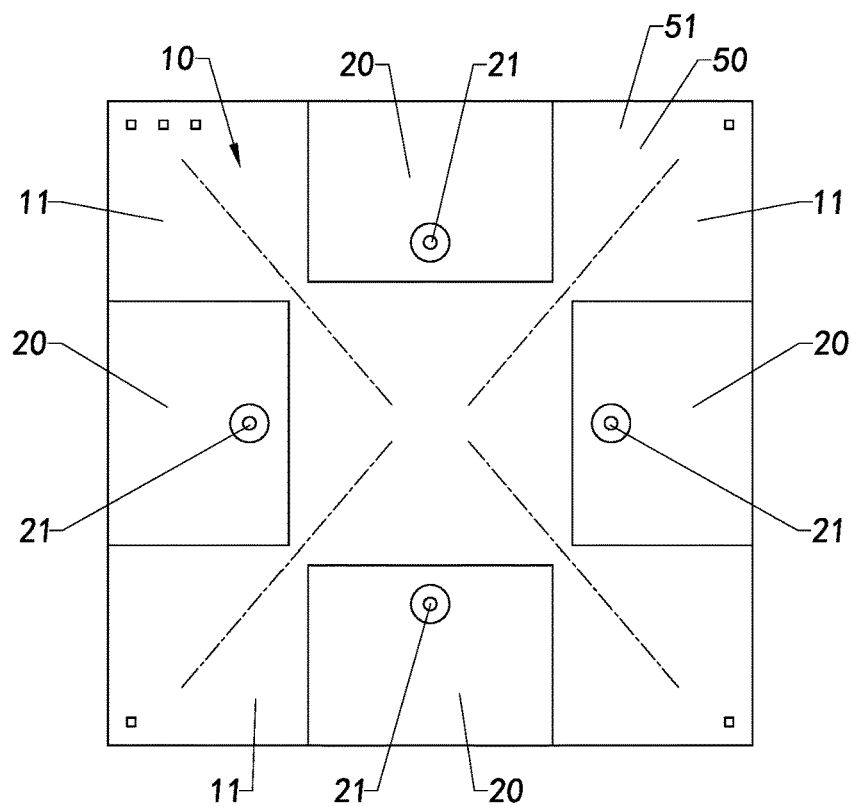
FIG. 5B is a top and schematic view of a multiple co-frequency microwaves detection antenna according to the above preferred embodiment of the present invention.
Figure 6A:
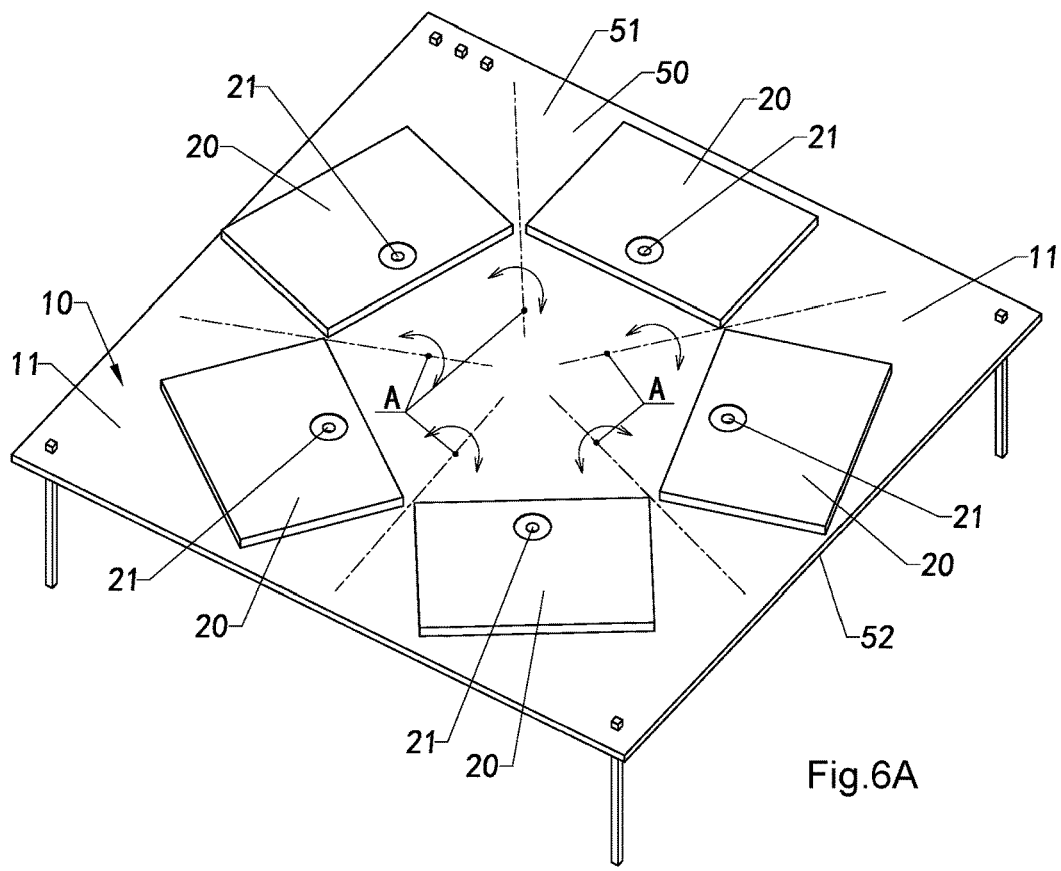
FIG. 6A is a stereogram and schematic view of a multiple co-frequency microwaves detection antenna according to another preferred embodiment of the present invention.
Figure 6B:
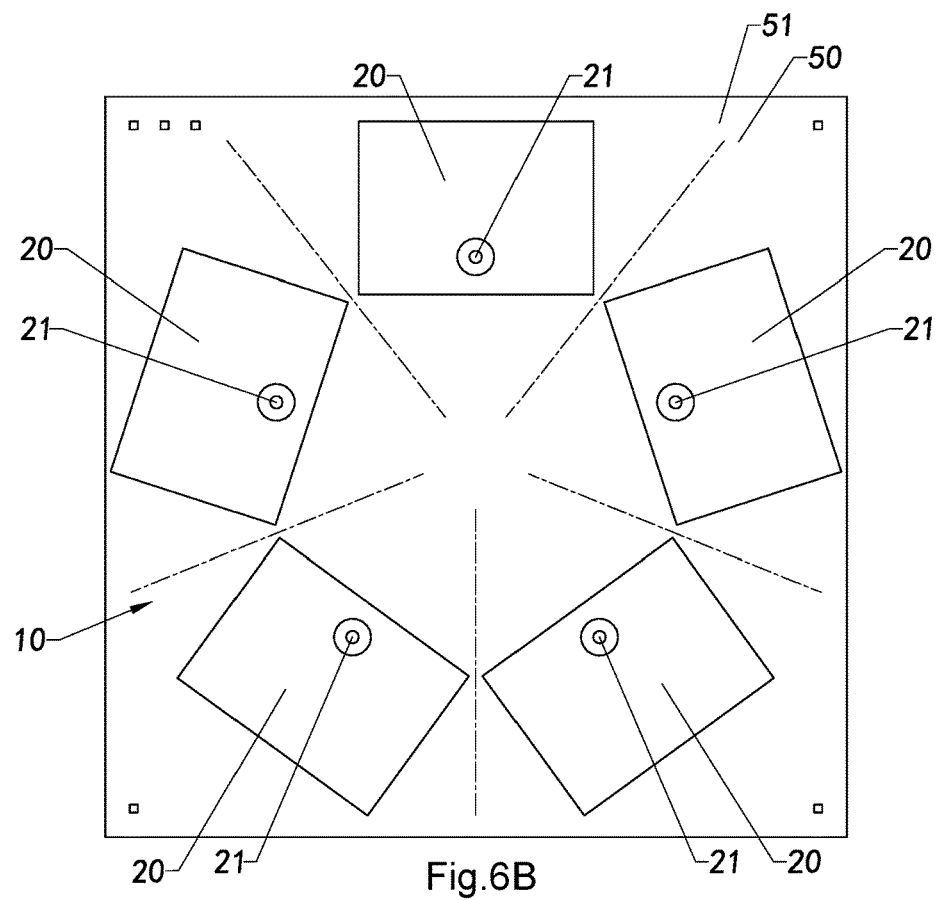
FIG. 6B is a top and schematic view of a multiple co-frequency microwaves detection antenna according to the above preferred embodiment of the present invention.
Figure 7A:
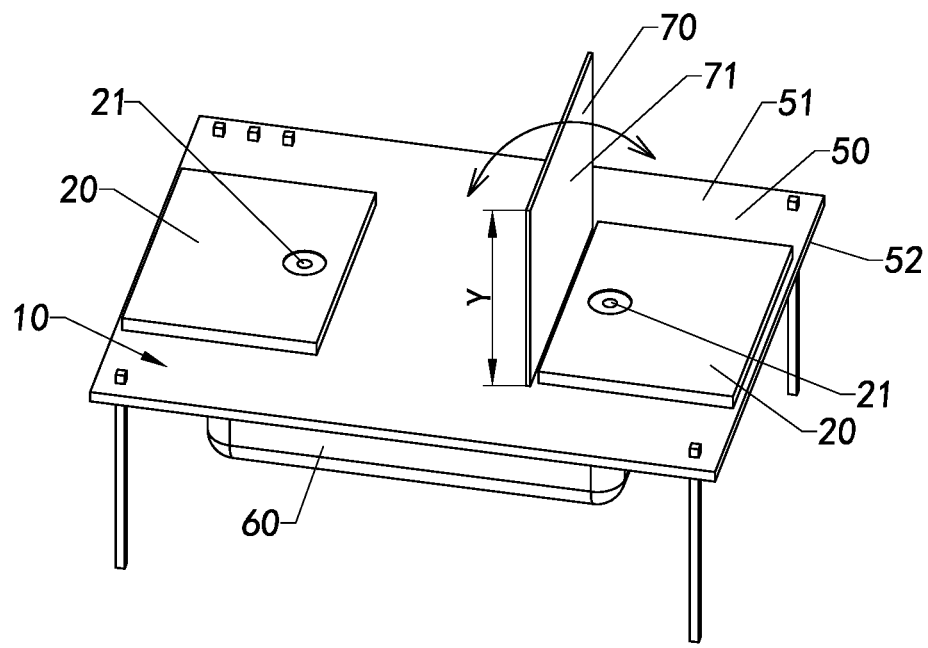
FIG. 7A is a schematic view of a multiple co-frequency microwaves detection antenna according to another preferred embodiment of the present invention.
Figure 7B:
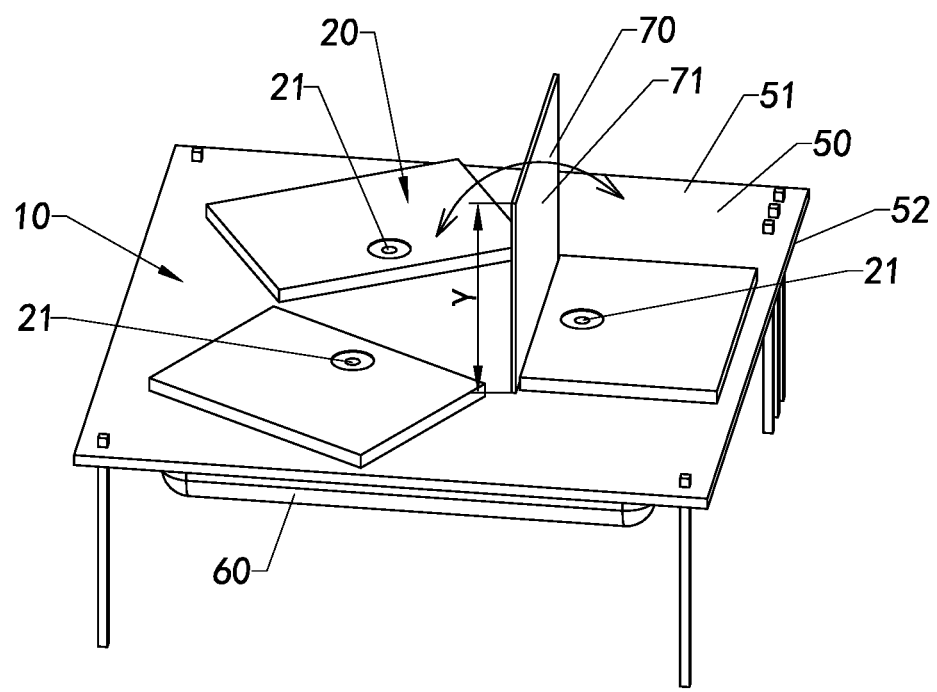
FIG. 7B is a schematic view of the multiple co-frequency microwaves detection antenna according to the above preferred embodiment of the present invention.
Figure 7C:
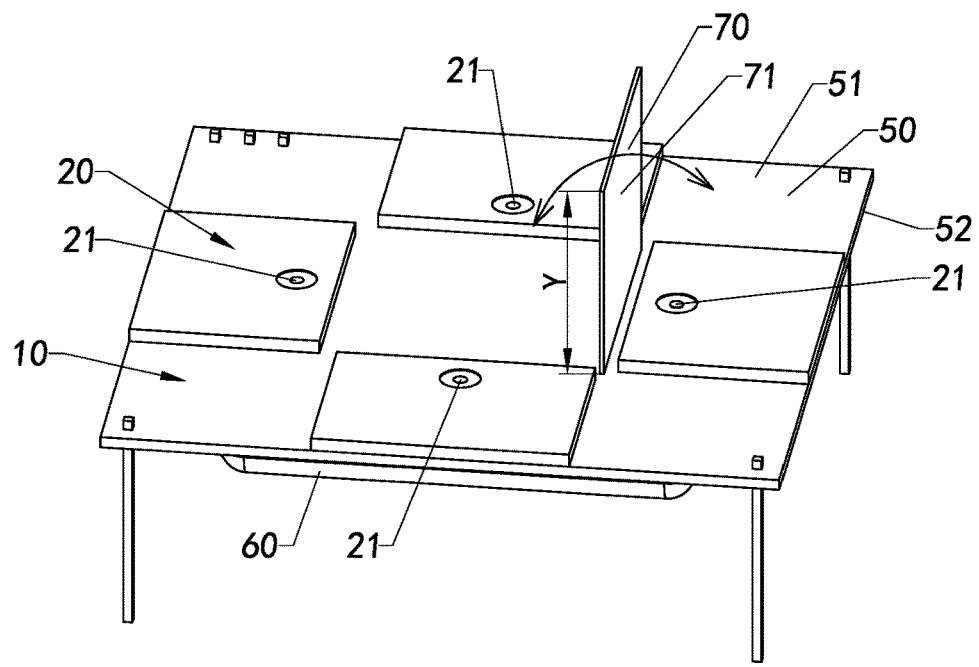
FIG. 7C is a schematic view of the multiple co-frequency microwaves detection antenna according to the above preferred embodiment of the present invention.
Figure 7D:
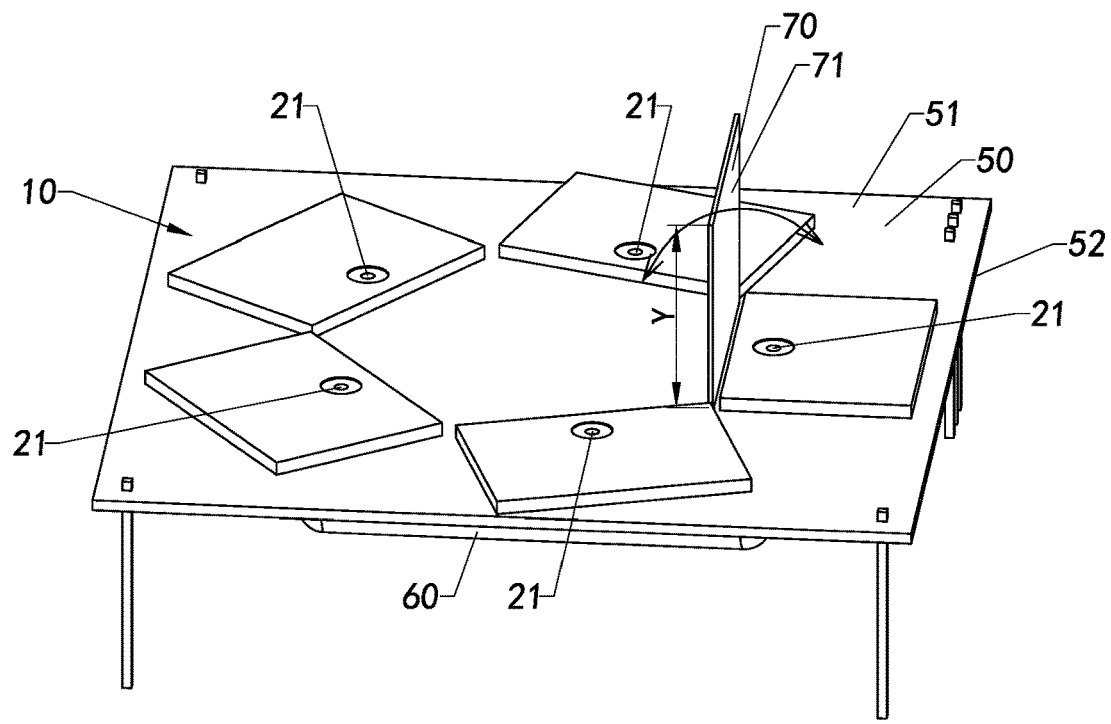
FIG. 7D is a schematic view of the multiple co-frequency microwaves detection antenna according to the above preferred embodiment of the present invention.
Figure 8A:
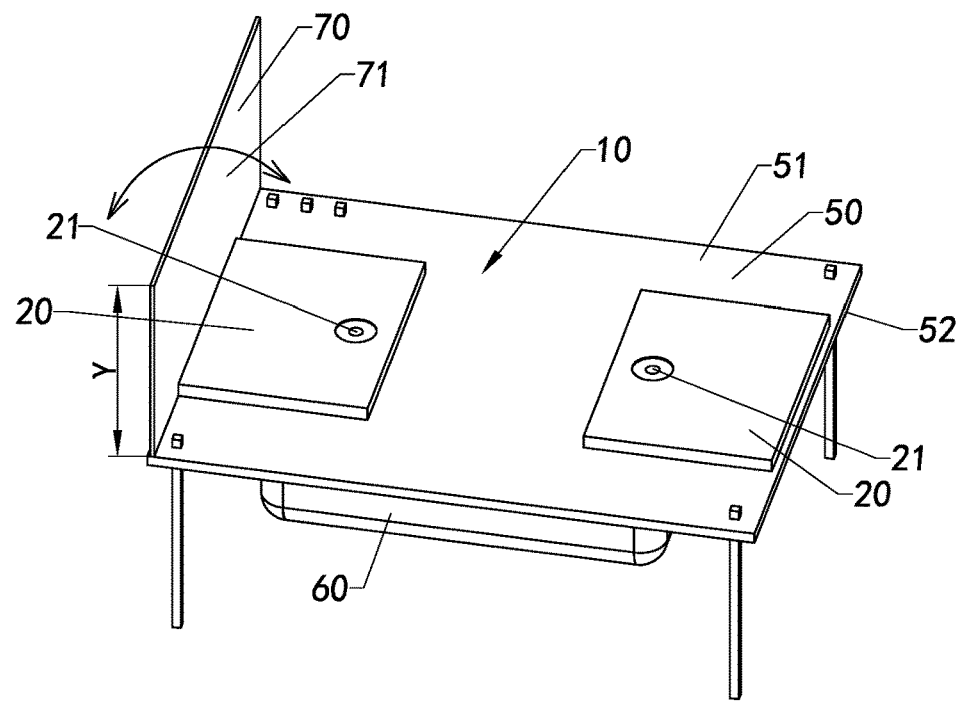
FIG. 8A is a stereogram and schematic view of a multiple co-frequency microwaves detection antenna according to another preferred embodiment of the present invention.
Figure 8B:
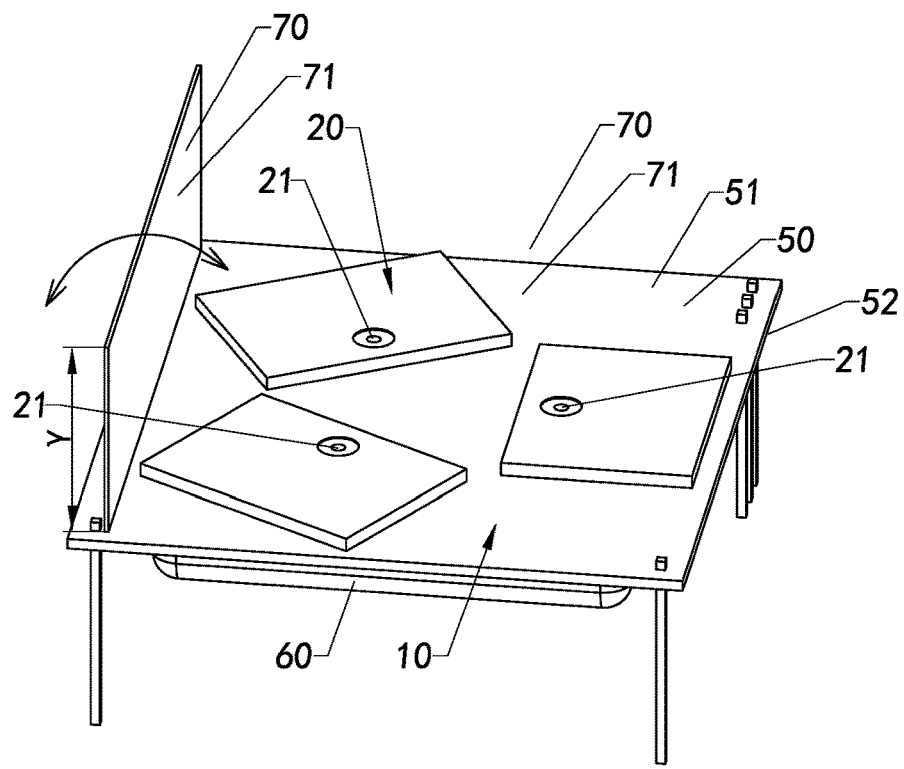
FIG. 8B is a stereogram and schematic view of a multiple co-frequency microwaves detection antenna according to another preferred embodiment of the present invention.
Figure 8C:
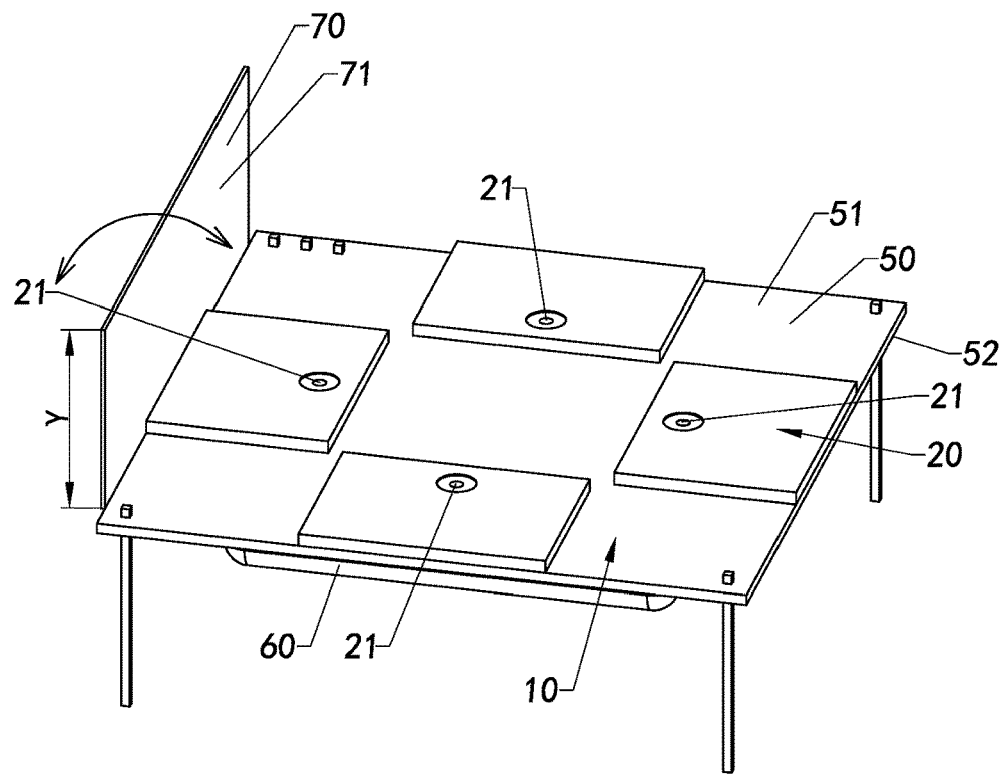
FIG. 8C is a stereogram and schematic view of a multiple co-frequency microwaves detection antenna according to another preferred embodiment of the present invention.
Figure 8D:
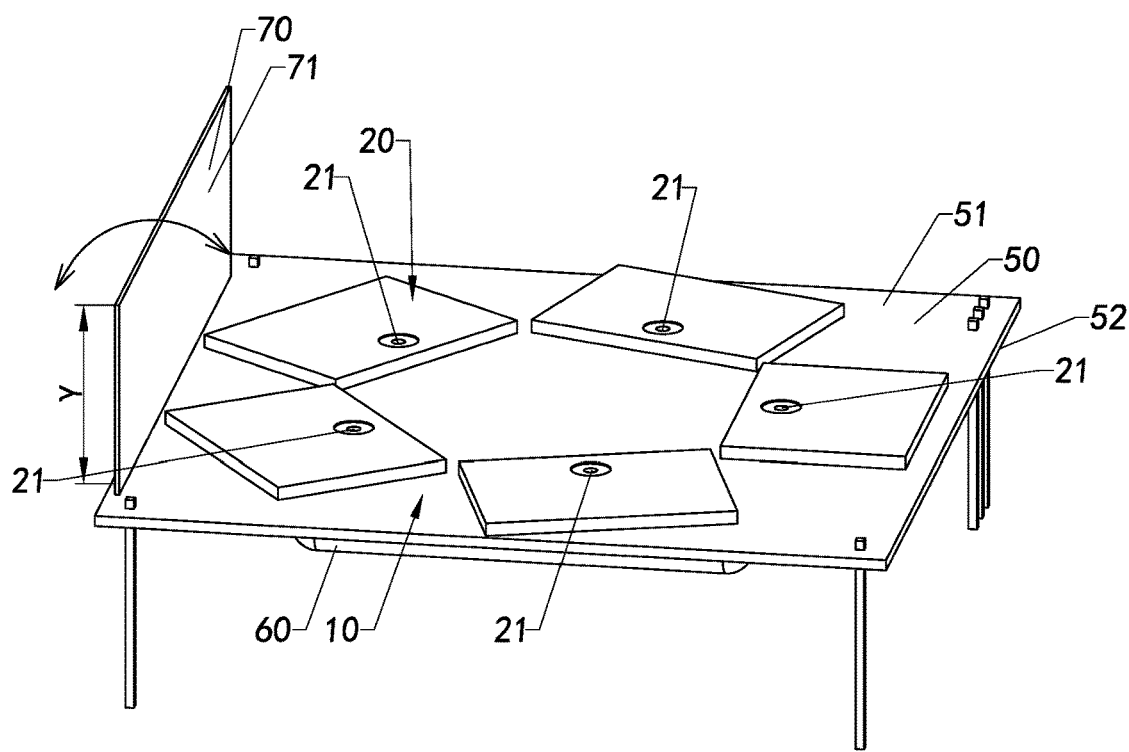
FIG. 8D is a stereogram and schematic view of a multiple co-frequency microwaves detection antenna according to another preferred embodiment of the present invention.
Figure 9A:
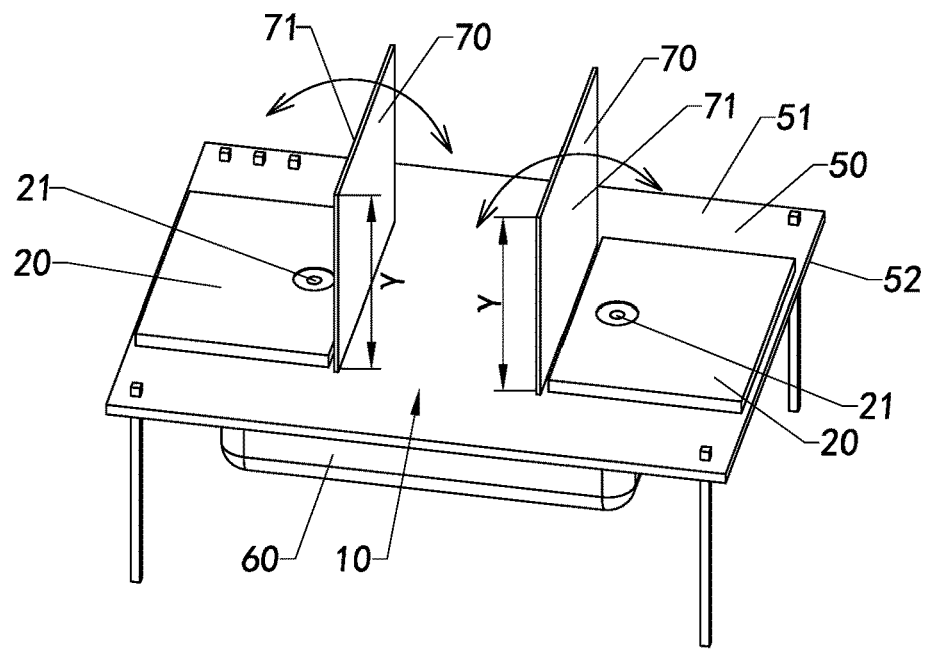
FIG. 9A is a stereogram and schematic view of a multiple co-frequency microwaves detection antenna according to another preferred embodiment of the present invention.
Figure 9B:
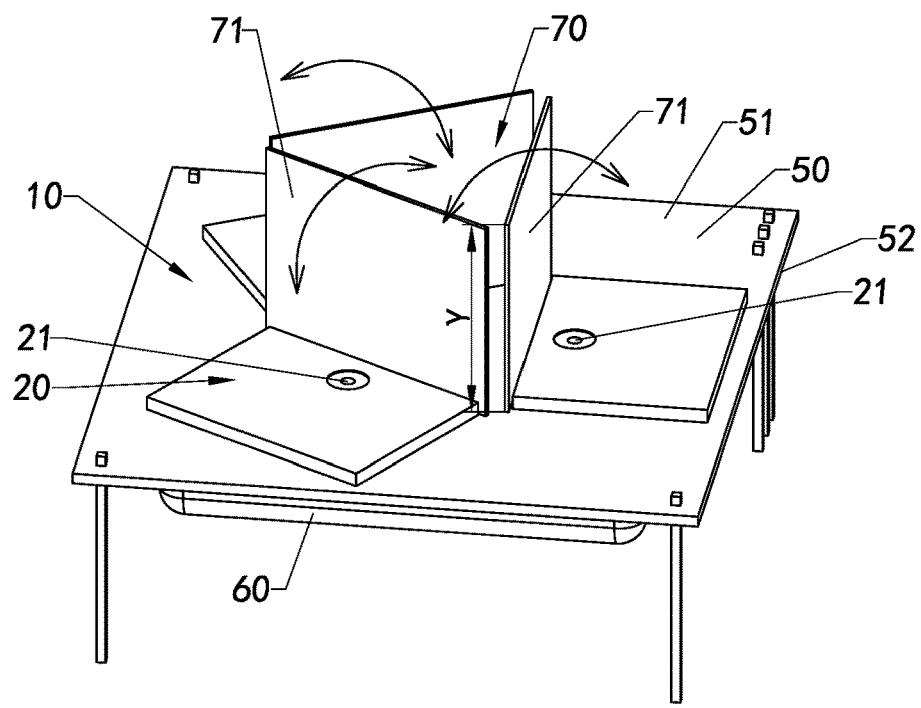
FIG. 9B is a stereogram and schematic view of a multiple co-frequency microwaves detection antenna according to another preferred embodiment of the present invention.
Figure 9C:
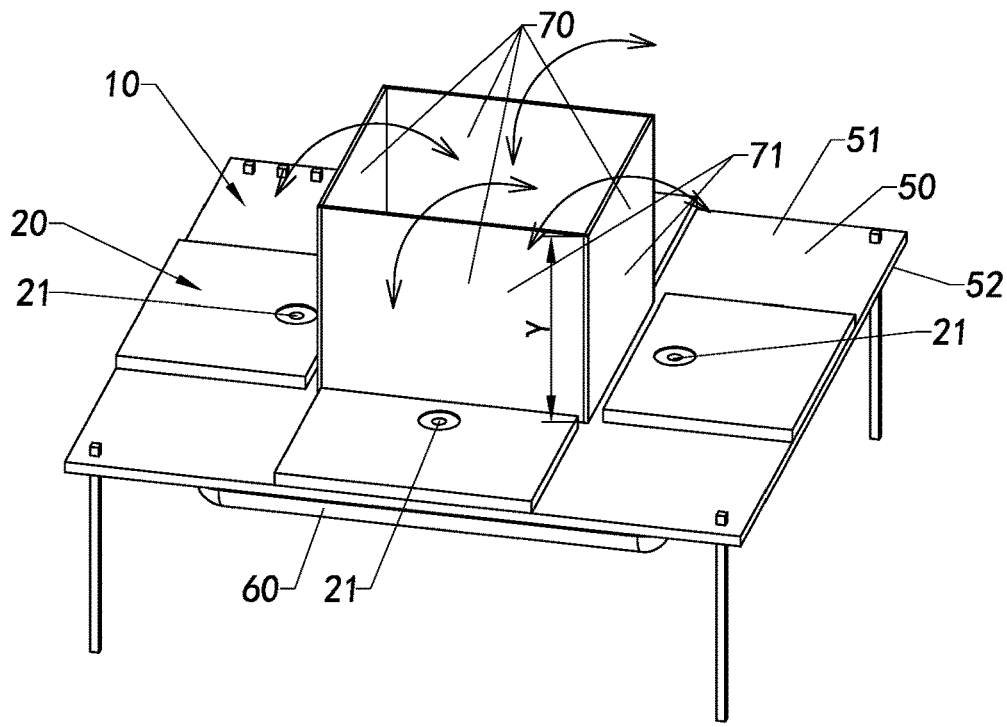
FIG. 9C is a stereogram and schematic view of a multiple co-frequency microwaves detection antenna according to another preferred embodiment of the present invention.
Figure 9D:
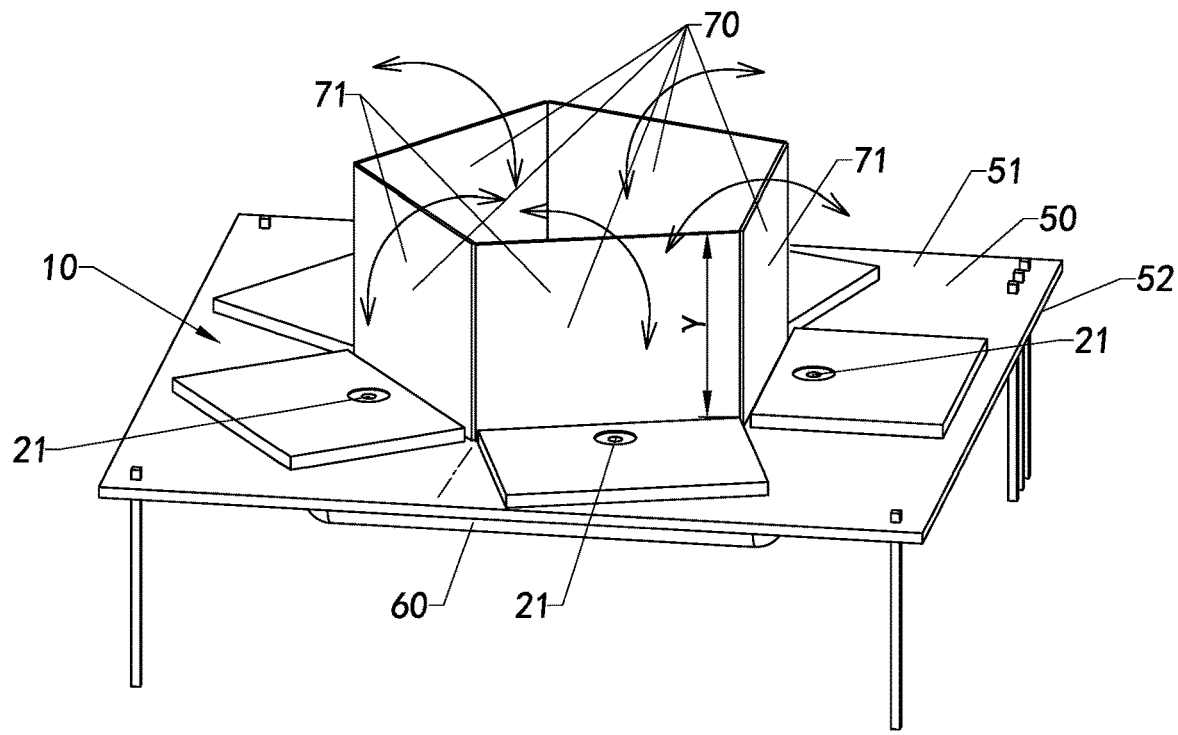
FIG. 9D is a stereogram and schematic view of a multiple co-frequency microwaves detection antenna according to another preferred embodiment of the present invention.

Referring to FIG. 4A and FIG. 4B, in other embodiments of the present invention, the specific number of the radiation sources 20 of the antenna is embodied as three, and the specific number of the reference ground bodies 11 is embodied as three. The extension direction of at least one reference ground body 12 is changed in a manner that the substrate 50 is deformed, thereby changing the relative position between the corresponding radiation source 20 and the other one of the radiation sources 20 to adjust the radiation direction of the microwave produced by the radiation source 20. Preferably, the three radiation sources 20 spacedly held on the reference ground bodies 11 may be arranged side by side intervally. Preferably, the three radiation sources 20 spacedly held on the reference ground 10 may be arranged side by side at a distance from one another. Preferably, the three radiation sources 20 spacedly held on the reference ground 10 may be distributed in a triangular shape intervally. It should be understood that the manner in which the radiation source 20 is distributed is merely an example and is not intended to limit the scope of the invention.

It is worth mentioning that the specific number of the radiation source 20 and the reference ground body 11 can also be implemented as four, five or more, wherein the position of at least one of the radiation sources 20 relative to the other radiation sources can be changed to change the radiation direction of the microwave generated by the radiation source 20, as shown in FIG. 5A to FIG. 6B. Moreover, it should be understood that the manner in which the radiation source 20 described in the drawings and the description is held on the side of the reference ground 10 is merely an example and should not be considered as a limitation on the content and range of the antenna of the present invention. The radiation sources 20 may be implemented to be circumferentially held on one side of the reference ground 10, or may be arranged in column or in row at the reference ground 10.

Referring to FIG. 7A to FIG. 9D, in some preferred embodiments of the present invention, the antenna further comprises at least a reflector 70. The reflector 70 has a reflective surface 71, wherein the reflector 70 is disposed at the reference ground body 11 corresponding to the radiation source 20 and is held on one side of the radiation source 20. Further, the reflective surface 71 forms an angle with the radiation source 20, wherein the angle between the reflective surface 71 and the radiation source 20 can be changed to change the radiation directions and the radiation angle of the microwaves. Preferably, the reflector 70 is made of a metal material, and the reflector 70 may be implemented as a metal plate made of a material such as copper or copper alloy.

Further, the reflector 70 is movably disposed on the reference ground body 11 corresponding to the radiation source 20. And, the angle between the reflective surface 71 of the reflector 70 and the reference ground body 11 can be dynamically adjusted to restrict the corresponding microwave in one or more directions to change the radiation angle and the radiation direction of the microwave, such that the reflector 70 can dynamically change the radiation direction and the radiation angle of the microwave generated by the radiation source 20 to dynamically change the detection area of the antenna.

Preferably, the reflector 70 is pivotally disposed at the reference ground 10. And, the angle between the reflective surface 71 of the reflector 70 and the radiation source 20 can be changed by rotating the reflector 70 to change the radiation direction and the radiation angle of the microwave generated by the radiation source 20. For example, when the reflector 70 is rotated in a manner that the reflective surface 71 is arranged to face to the radiation source 20, the reflective surface 71 is close to the radiation source 20, and the angle between the reflective surface 71 and the radiation source 20 is reduced, so that the overlapped area formed by the microwaves generated by the radiation sources 20 can be increased. When the reflector 70 is rotated in a manner that the reflective surface 71 is away from the radiation source 20, the reflective surface 71 and the radiation source 20 are away from each other, and the angle between the reflective surface 71 and the radiation source 20 is increased, so that the overlapped area of the microwaves generated by the radiation sources 20 can be reduced, thereby dynamically adjusting the detection area of the antenna. It is worth mentioning that the manner of adjusting the angle between the reflective surface 71 of the reflector 70 and the radiation source 20 is merely an example and cannot be a limitation on the content and scope of the antenna of the present invention.

The specific number of the reflectors 70 is not limited. And the reflective surface 71 of the reflector 70 may be implemented to reflect or constraint the microwave radiated outwardly by one of the radiation source 20, or may be implemented to change the radiation directions and radiation angle of the microwaves radiated by at least two radiation sources 20 outward.

Preferably, the number of the reflector 70 is implemented as one, as shown in the FIG. 7A to FIG. 7D. For example, the reflector 70 disposed at the reference ground body 11 is disposed on one side of the radiation source 20 which is one of the at least two of the radiation sources 20 in such a manner that the reflective surface 71 faces the radiation source 20. The reflector 70 is located between at least two of the radiation sources 20, and the reflective surface 71 of the reflector 70 is adjacent to the radiation source 20. The angle is formed between the reflective surface 71 of the reflector 70 and the corresponding radiation source 20. The radiation direction and the radiation angle of the microwave generated by the radiation source 20 can be varied by dynamically adjusting the angle between the reflective surface 71 and the radiation source 20. Further, the detection area of the antenna can be dynamically changed by dynamically adjusting the radiation direction and the radiation angle of the microwave radiated outward by the radiation source 20.

Referring to FIG. 8A to FIG. 8D, in other embodiments of the present invention, the number of the reflector 70 is implemented as one. And the reflector 70 is disposed at the reference ground body 11 of the reference ground 10 in such a manner that the reflective surface 71 faces the radiation source 20. The reflective surface 71 can form an angle with at least one radiation source 20 to reflect the microwave generated by the radiation source 20, thereby changing the detection area of the antenna. Further, the angle between the reflective surface 71 and the radiation source 20 can be dynamically adjusted. That is, the reflective surface 71 of the reflector 70 can dynamically reflect the microwaves generated by at least one radiation sources 20, so as to change the radiation direction and the radiation angle of the microwave to change the detection area of the antenna.

Preferably, the number of the reflectors 70 is arranged to match with the number of the radiation sources 20, as shown in FIG. 9A to FIG. 9D. For example, referring to FIG. 9A, two of the reflectors 70 are disposed on the reference ground bodies 11 corresponding to the radiation sources 20, and the two reflectors 70 are respectively held on the sides of the two radiation sources 20 in a manner that the reflective surfaces 71 are respectively corresponding to the radiation sources 20. And, the reflective surface 71 of the reflector 70 can respectively form the angle with the corresponding radiation source 20. Optionally, the two reflectors 70 are held between the two radiation sources 20. Optionally, the two reflectors 70 are held on opposite sides of the reference ground 10. It is worth mentioning that the specific number of the reflectors 70 and the radiation sources 20 is merely an example. The number of the reflectors 70 is not limited, and the reflectors 70 may be implemented as three, four, five or more.

Preferably, the length of the reflector 70 is greater than or equal to the length of a long side of the radiation source 20. The width of the reflector 70 is a parameter $\gamma$, and the parameter $\gamma$ ranges: $\frac{1}{16}\lambda \leq \gamma \leq \lambda$, wherein the parameter $\lambda$ is a wavelength of the microwave that the radiation source 20 is capable of receiving or generating.

According to some preferred embodiments of the present invention, as shown in FIG. 10A to FIG. 15B, the substrate 50 further comprises a first substrate 501 and a plurality of second substrates 502, wherein the plurality of second substrates 502 is extended from the first substrate 501 and spaced apart from each other. And the plurality of second substrates 502 is arranged to surround a circumference of the first substrate 501. At least one of the reference ground bodies 11 is disposed on the first substrate 501. The radiation sources 20 are spacedly held at sides of the reference ground bodies 11 respectively, wherein the radiation gap 40 is formed between the reference ground body 11 and the radiation source 20. At least one of the reference ground bodies 11 is disposed on the second substrates 502 and the radiation gap 40 is formed between the reference ground body 11 and the radiation source 20. The feed point 21 of each of the radiation sources 20 is electrically connected to the same oscillation circuit unit 30 such that the frequencies of the microwaves radiated from the different radiation sources 20 are the same. Further, the radiation direction and the radiation angle of the microwave radiated by the radiation source 20 can be adjusted. On one hand, it is advantageous to enlarge the detection area of the antenna, and on the other hand, it is advantageous to improve the detection efficiency and accuracy of the antenna.

In particular, the number of the second substrate 502 is not limited. And in some embodiments of the present invention, the first substrate 501 may not be provided with the radiation source 20 or the reference ground body 11. That is, a flexible connection between the first substrate 501 and the second substrate 502 is able to change a position of the radiation source 20 of the first substrate 501 relative to the radiation source 20 of the second substrate 502, and to change the relative positions between the radiation sources 20 of the different second substrates 502. But when the first substrate 501 is not provided with the radiation source 20 or the reference ground body 11, the relative positions can between the radiation sources 20 of the different second substrates 502 can still be changed by the flexible connection between the first substrate 501 and the second substrate 502. The invention is not limited thereto.

Figure 10A:
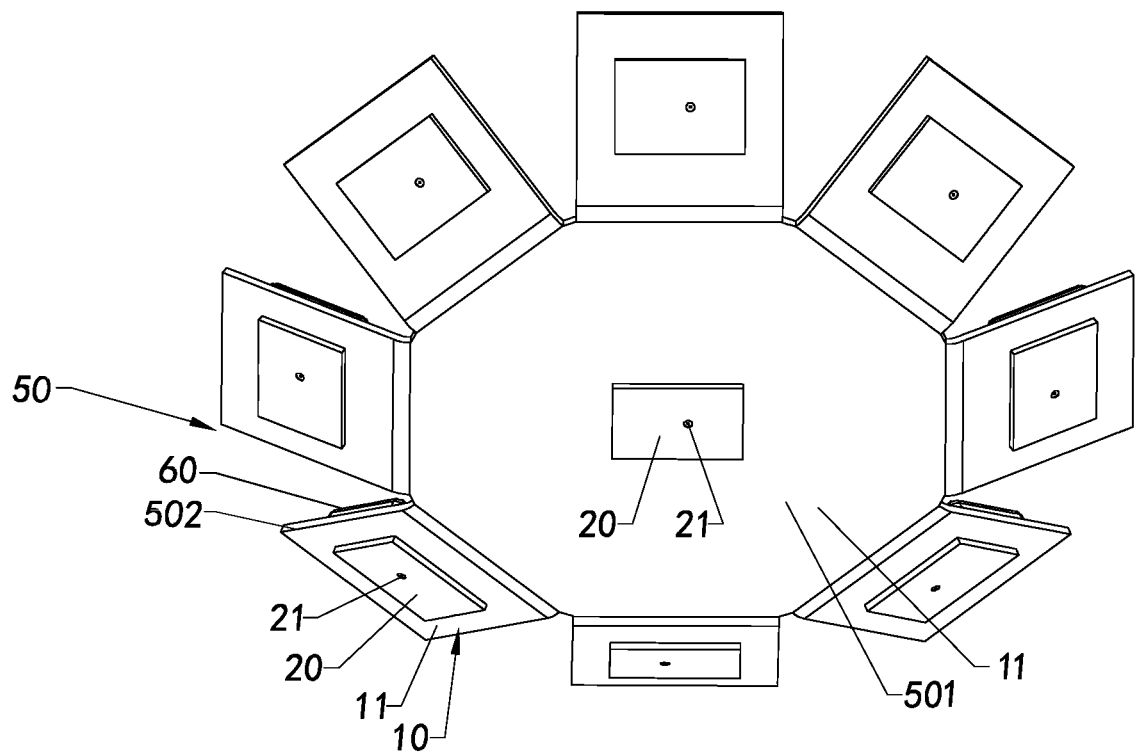
FIG. 10A is a stereogram and schematic view of a multiple co-frequency microwaves detection antenna according to another preferred embodiment of the present invention.
Figure 10B:
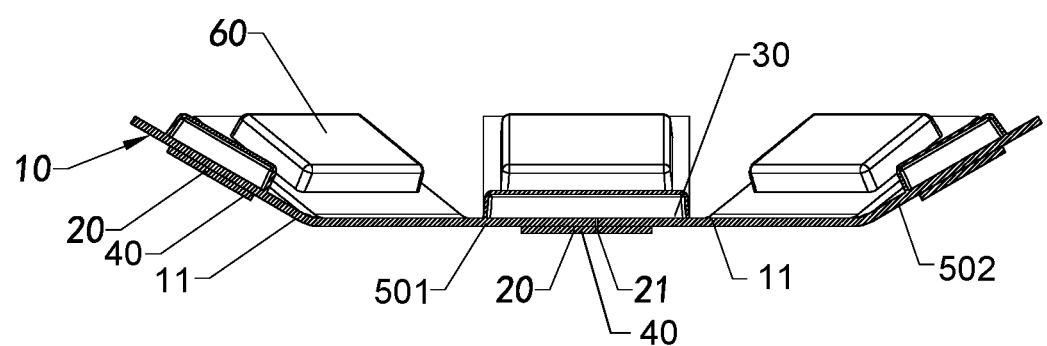
FIG. 10B is a stereogram and schematic view of a multiple co-frequency microwaves detection antenna according to another preferred embodiment of the present invention.

Referring to FIG. 10A and FIG. 10B, an angle between any one of the second substrates 502 and the first substrate 501 can be adjusted. Preferably, the first substrate 501 and the second substrates 502 have flexibility. The first substrate 501 or the second substrate 502 is arranged to change the relative angle between the first substrate 501 and the second substrate 502 in a manner of generating deformation. For example, the second substrate 502 can be flexibly deformed to be folded upward or downward relative to the first substrate 501. When the first substrate 501 or the second substrate 502 is flexibly deformed, an extension direction of the corresponding reference ground body 11 is changed and the position for the radiation source 20 corresponding to the reference ground body 11 relative to the other radiation source 20 is changed, so that the radiation area of the microwave generated by the antenna is changed. Further, the adjacent second substrates 502 are independent with each other to allow a user to individually adjust the extension direction of any of the second substrates 502 to change the radiation direction of the microwave generated by the corresponding radiation source 20 and to maintain the radiation directions of the microwaves generated by the other radiation sources 20 unchanged, so as to facilitate adjusting the detection area of the antenna by dynamically adjusting the second substrates 502. Preferably, the first substrate 501 and the second substrates 502 are flexible deformable PCB boards, such as FPC boards, and at least a portion of the first substrate 501 and the second substrates 502 can be bent. Preferably, the first substrate 501 is a PCB board. That is, the first substrate 501 is a rigid circuit board and the first substrate 501 cannot change the extension direction by deformation. The second substrates 502 arranged to surround the first substrate 501 are flexible deformable PCB boards, and that the radiation directions of the microwaves generated by the radiation sources 20 can be changed by adjusting the extension directions of the second substrates 502. It should be understood that in other embodiments of the present invention, the first substrate 501 cannot be changed in extension direction by being deformed in a manner of providing a rigid fixing member on one side of the flexible first substrate 501 to allow the user to change the radiation direction of the microwave generated by the radiation source 20 only by adjusting the extension direction of the second substrate 502.

Figure 11A:
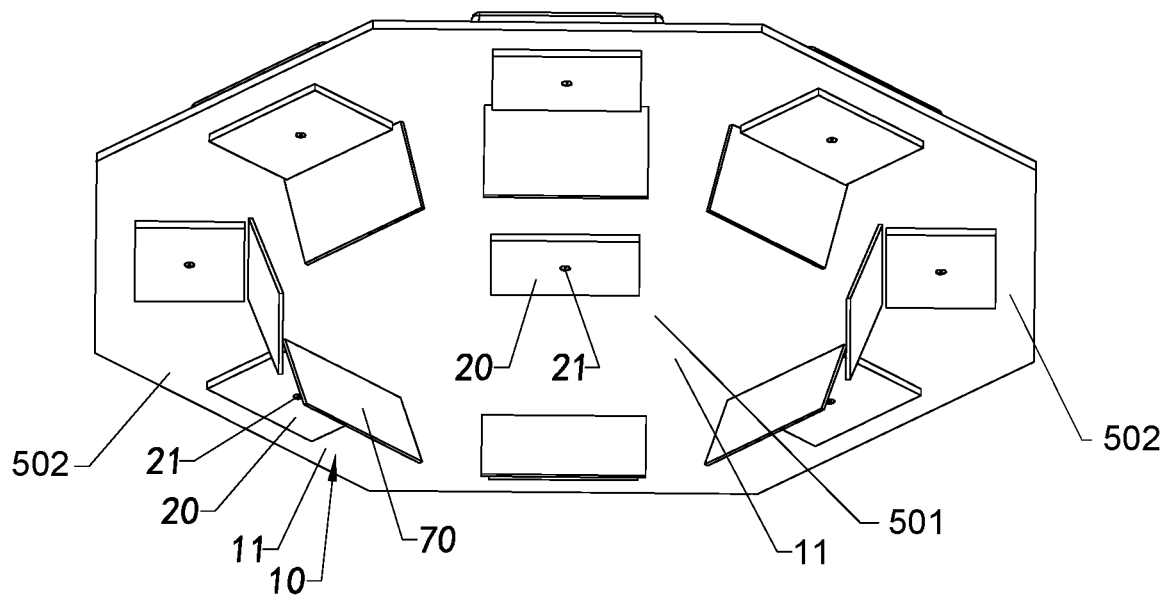
FIG. 11A is a stereogram and schematic view of a multiple co-frequency microwaves detection antenna according to another preferred embodiment of the present invention.
Figure 11B:
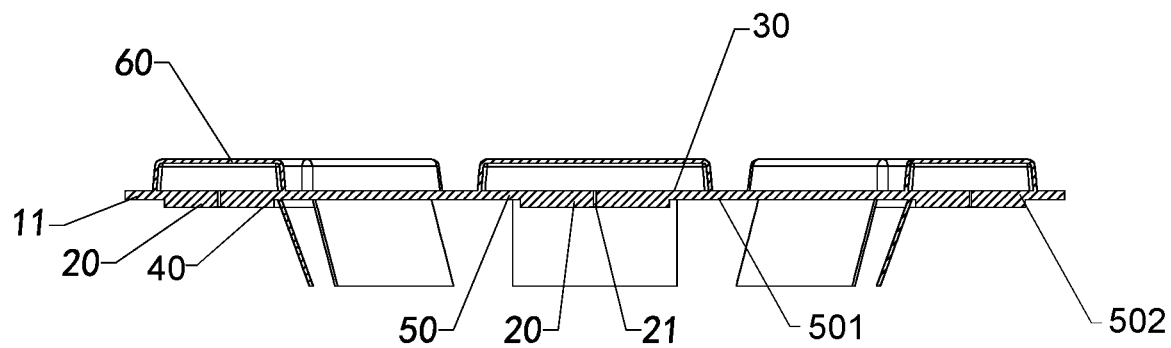
FIG. 11B is a sectional view of the multiple co-frequency microwaves detection antenna according to the above preferred embodiment of the present invention.

In a preferred embodiment of the present invention, referring to FIG. 11A and FIG. 11B, the first substrate 501 and the second substrates 502 are PCB boards, and the adjacent second substrates 502 are connected to each other. The reflectors 70 are disposed on the reference ground bodies 11 corresponding to the radiation sources 20. The reflectors 70 are held on the second substrates 502, and the plurality of reflectors 70 is arranged to surround the radiation source 20 corresponding to the first substrate 501. Preferably, the reflective surface 71 of at least one of the reflectors 70 is arranged to face the radiation source 20 corresponding to the second substrate 502. That is, the reflective surface 71 of the reflector 70 reflects and constraints the microwave generated by the radiation source 20 corresponding to the second substrate 502. Preferably, the reflective surface 71 of the at least one of the reflectors 70 is arranged to face the radiation source 20 corresponding to the first substrate 501. That is, the reflective surface 71 of the reflector 70 reflects the microwave generated by the radiation source 20 corresponding to the first substrate 501.

Figure 14A:
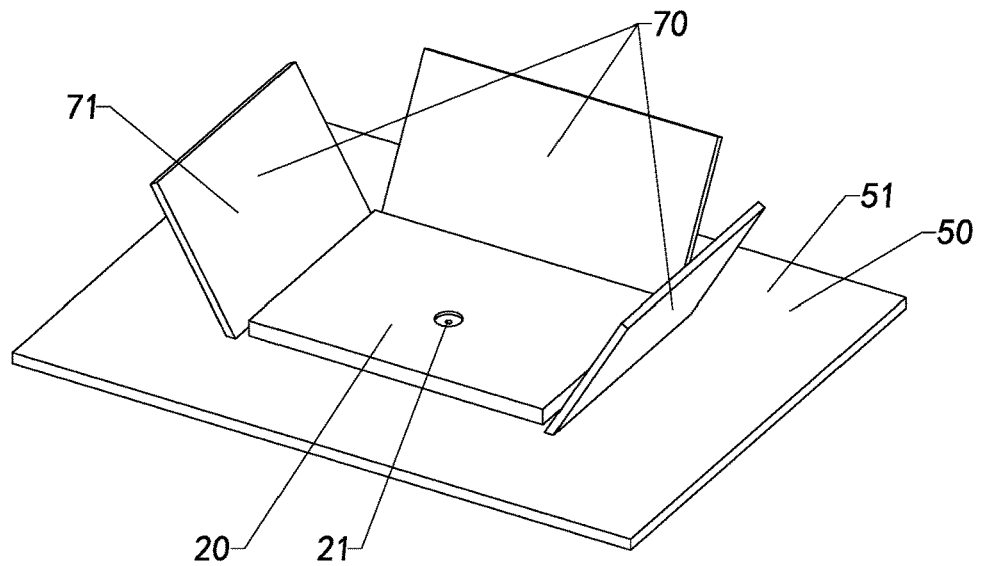
FIG. 14A is a schematic view of a multiple co-frequency microwaves detection antenna according to another preferred embodiment of the present invention.
Figure 14B:
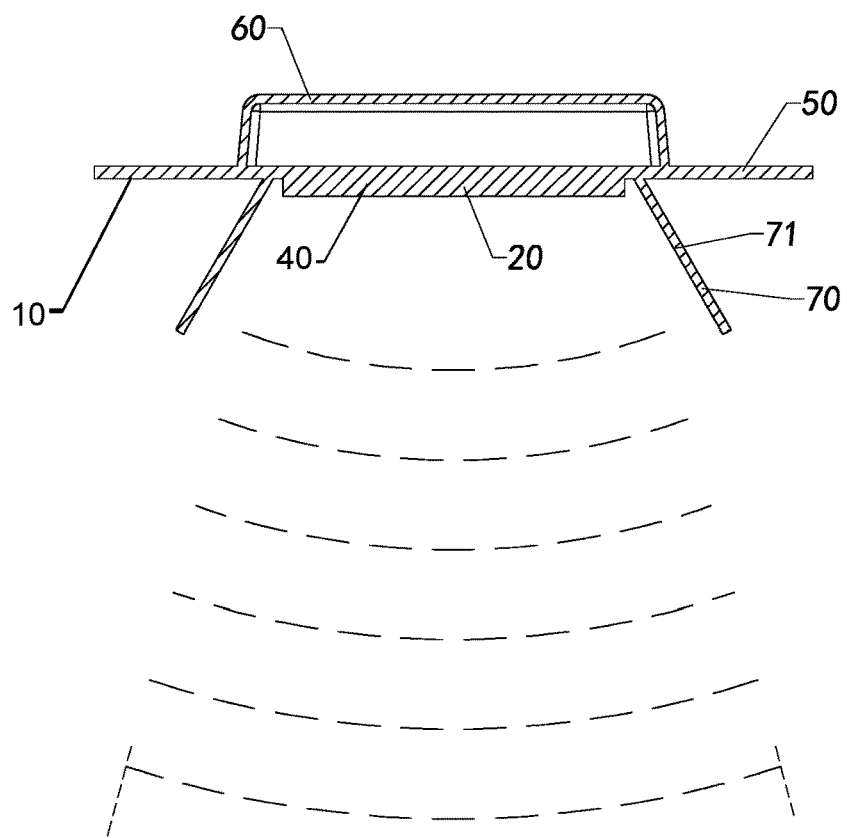
FIG. 14B is a schematic view of a multiple co-frequency microwaves detection antenna according to another preferred embodiment of the present invention.
Figure 15A:
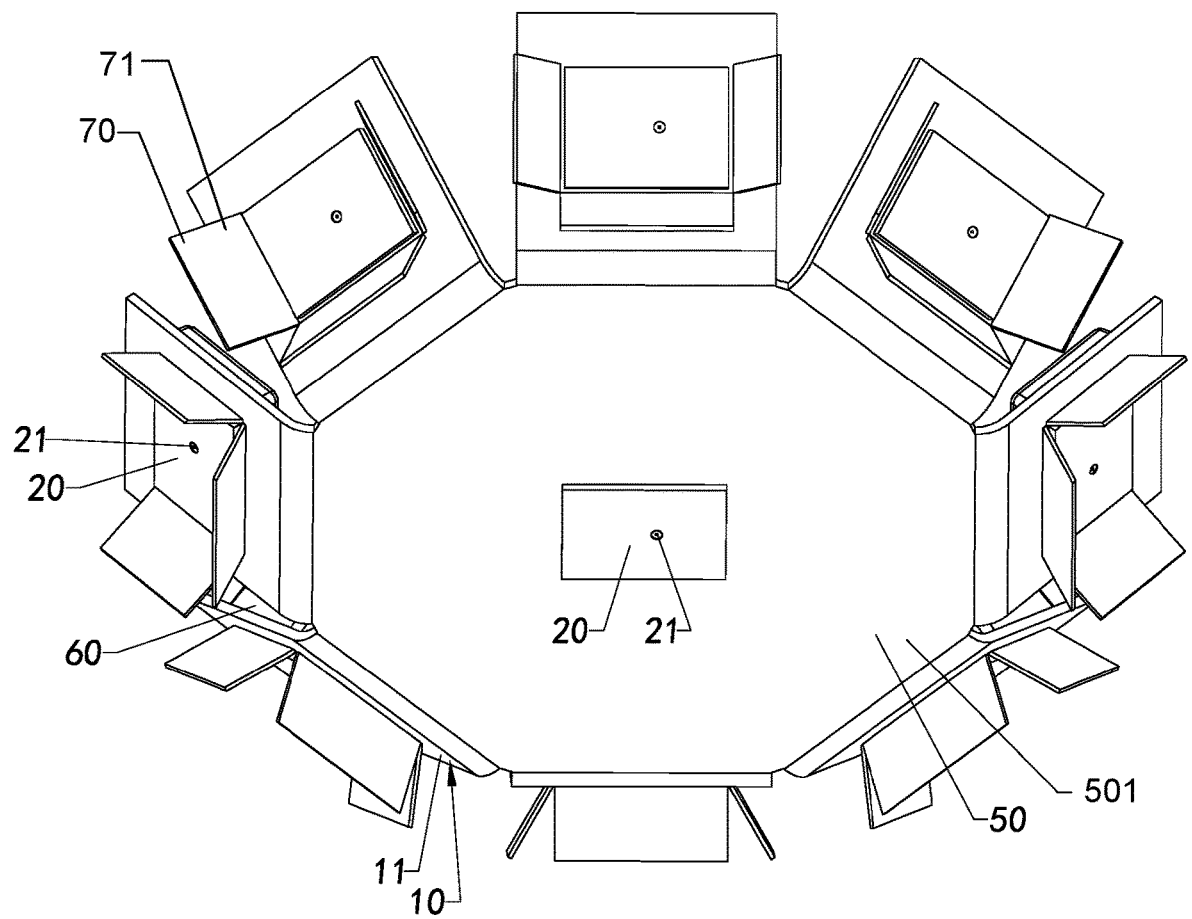
FIG. 15A is a schematic view of a multiple co-frequency microwaves detection antenna according to another preferred embodiment of the present invention.
Figure 15B:
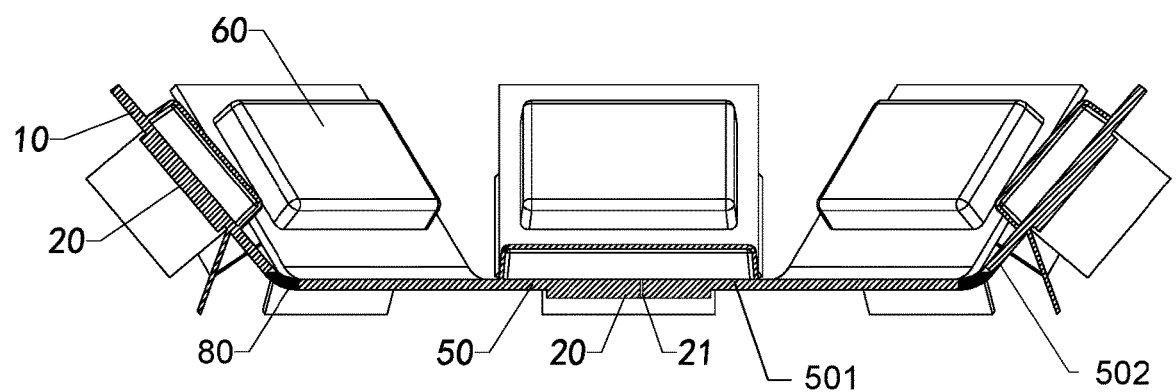
FIG. 15B is a schematic view of a multiple co-frequency microwaves detection antenna according to another preferred embodiment of the present invention.

Further, referring to FIG. 14A and FIG. 14B, the angle between the reflective surface 71 of the reflector 70 and the reference ground body 11 can be dynamically adjusted, and thus the reflector 70 can be arranged to dynamically change the radiation direction and the radiation angle of the microwave generated by the radiation source 20 to dynamically change the detection area of the antenna. Preferably, the reflector 70 is pivotally disposed at the reference ground 10, and the angle between the reflective surface 71 of the reflector 70 and the radiation source 20 can be changed by rotating the reflector 70 to change the radiation direction and the radiation angle of the microwave generated by the radiation source 20.

In some embodiments of the invention, the radiation direction of the microwave generated by the antenna is adjusted by the first substrate 501 or the second substrates 502 and the reflectors 70. For example, referring to FIG. 13A and FIG. 13B, the first substrate 501 and the second substrates 502 are flexible deformable PCB boards, and at least one of the reflectors 70 is maintained on one side of the second substrate 502 in a manner that the reflective surface 71 is arranged to face the second substrate 502. That is, at least a portion of the first substrate 501 and the second substrates 502 can be deformed to be bent to change the relative position of the corresponding radiation source 20 and other radiation sources 20. At the same time, the reflector 70 reflects or constraints the microwave generated by the corresponding radiation source 20, so that the reflector 70, the first substrate 501 and the second substrates 502 can be arranged to cooperate to adjust the radiation direction and the radiation angle of the microwave generated by the antenna.

Figure 12A:
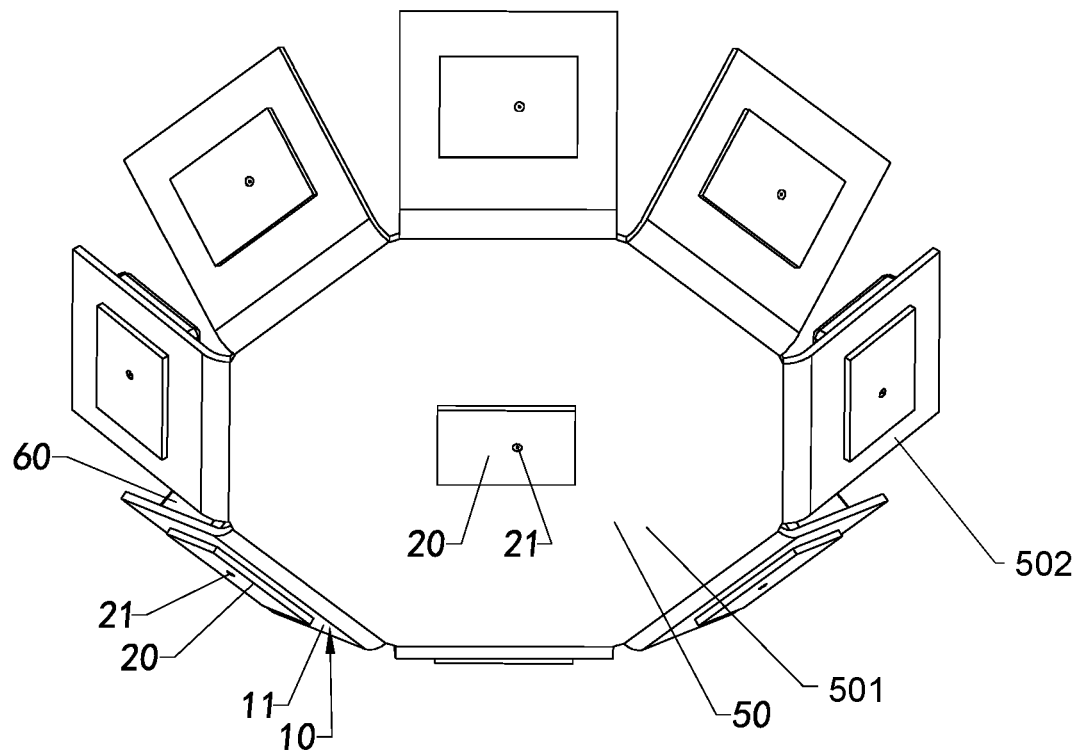
FIG. 12A is a schematic view of a multiple co-frequency microwaves detection antenna according to another preferred embodiment of the present invention.
Figure 12B:
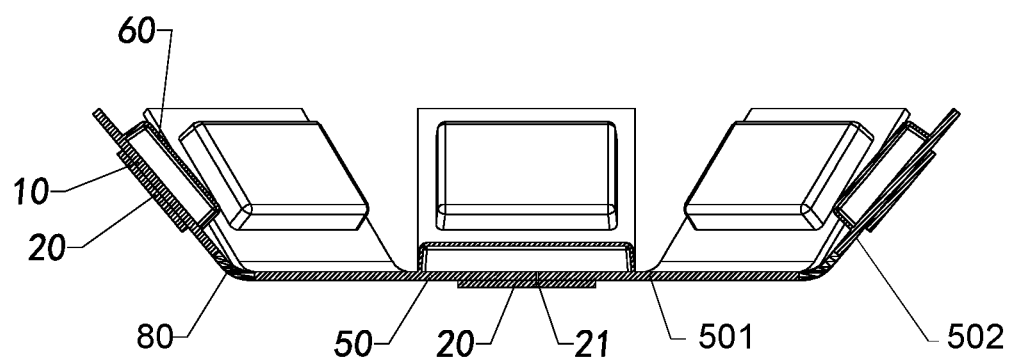
FIG. 12B is a schematic view of the multiple co-frequency microwaves detection antenna according to the above preferred embodiment of the present invention.
Figure 13A:
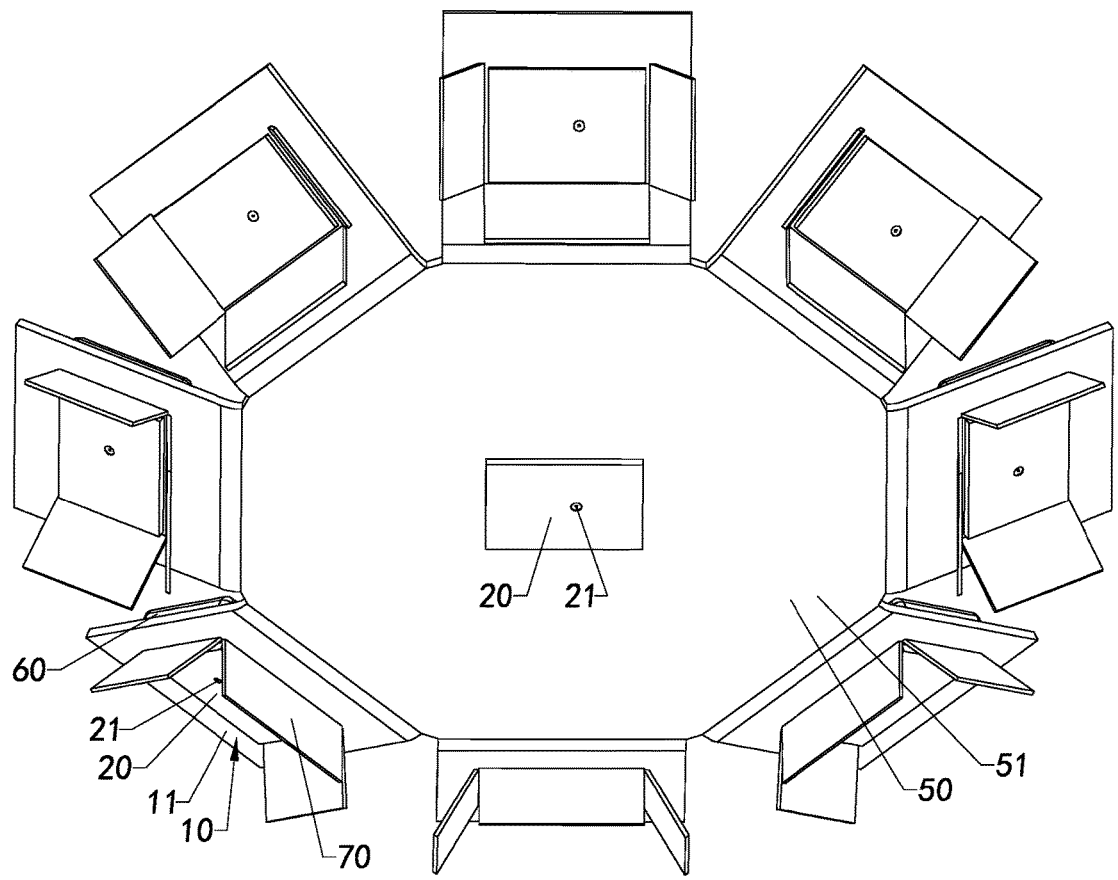
FIG. 13A is a schematic view of a multiple co-frequency microwaves detection antenna according to another preferred embodiment of the present invention.
Figure 13B:
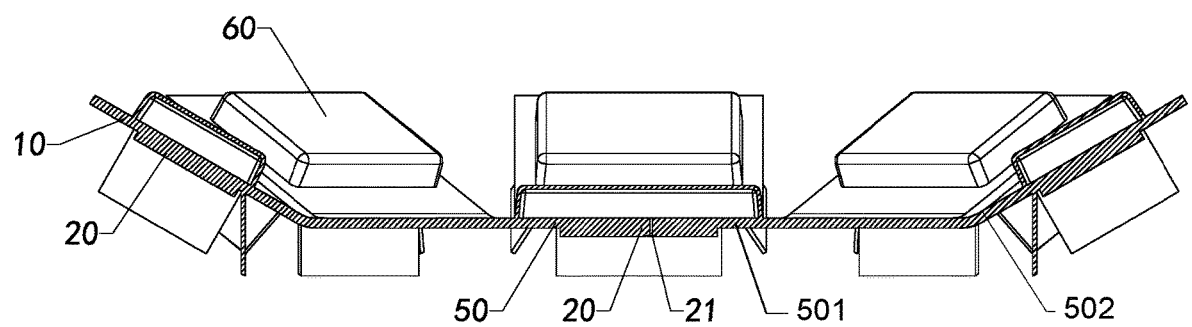
FIG. 13B is a schematic view of a multiple co-frequency microwaves detection antenna according to another preferred embodiment of the present invention.

In one preferred embodiment of the present invention, referring to FIG. 12A and FIG. 12B, the antenna further comprises a flexible connector 80. Two ends of the flexible connector 80 are respectively connected to the first substrate 501 and the second substrate 502. And the flexible connector 80 are respectively electrically connected to the reference ground body 11 corresponding to the first substrate 501 and the reference ground body 11 corresponding to the second substrate 502. The flexible connector 80 is made to have a predetermined flexibility that, when the flexible connector 80 is flexibly deformed, the extension direction of the first substrate 501 or the second substrate 502 connected to one end of the flexible connector 80 is changed to change the relative angle between the first substrate 501 and the second substrate 502, thereby adjusting the radiation direction of the microwave generated by the corresponding radiation source 20. For example, the flexible connector 80 can be flexibly deformed such that the second substrate 502 is folded upwardly or downwardly with respect to the first substrate 501. The extension direction of the corresponding reference ground body 11 is changed. The position of the radiation source 20 corresponding to the reference ground body 11 in relative to the other of the radiation sources 20 is changed, so that the radiation area of the microwave generated by the antenna is changed. Preferably, the flexible connector 80 is detachably mounted at the first substrate 501 such that the second substrates 502 are detachably mounted to the first substrate 501, and the user can select the detection range of the antenna in a manner to increase or reduce the number of the second substrate 502 according to a needed requirement, thereby improving the flexibility of the antenna.

In some embodiments of the invention, the radiation direction of the microwave generated by the antenna is adjusted by the flexible connector 80 and the reflector 70. For example, referring to FIG. 15A and FIG. 15B, the first substrate 501 and the second substrates 502 are implemented as PCB boards, and the flexible connectors 80 connected the first substrate 501 to the second substrates 502 are deformed to change the extension directions of the first substrate 501 or the second substrate 502. At the same time, the flexible connectors 80 and the reflectors 70 are arranged to cooperate to adjust the radiation directions and the radiation angles of the microwaves generated by the antenna by the reflectors 70 reflecting or constraining the microwaves generated the radiation sources 20 corresponding to the reflectors 70.

Further, the antenna receives an echo formed by the microwave radiated outwardly via the radiation source 20, and determines the motion state of the target object in the target area according to a frequency change of the received echo. Specifically, an analog circuit 100 is illustrated in FIG. 16, wherein the analog circuit 100 is in an equivalent and electrical connection state for each of the radiation sources 20 and the reference ground 10 of the antenna under the action of the microwave excitation electrical signal. It should be understood that each of the radiation sources 20 is corresponding to one of the analog circuits 100.

It is worth mentioning that different radiation sources 20 of the antenna can outwardly radiate the plurality of microwaves having the same frequencies, so that the antenna uses the multiple microwaves to simultaneously detect different target areas, thereby expanding detection area and improving the detection efficiency of the antenna.

Further, the antenna comprises at least a mixer and detector circuit 200, wherein two ends of the mixer and detector circuit 200 are electrically connected to the oscillation circuit unit 30 and the feeding point 21 of the radiation source 20 respectively. The echo received by the antenna forms an electrical signal, and the electrical signal is arranged to pass from the radiation source 20 to the mixer and detector circuit 200 electrically connected to the radiation source 20 to subsequently obtain the frequency change of the echo according to the electrical signal received by the mixer and detector circuit 200, and further to determine the motion state of the target object in the target area detected by the antenna. Preferably, the specific number of the mixer and detector circuits 200 is embodied as one, and it can be determined for the motion state of the target object within the target area detected by the microwaves which are generated by at least two radiation sources 20 of the antenna, according to the change of the electrical signal which is arranged to pass through the mixer and detector circuit 200. Specifically, one end of the mixer and detector circuit 200 is electrically connected to the feeding points 21 of at least two radiation sources 20, and the other end of the mixer and detector circuit 200 is electrically connected to the oscillation circuit unit 30. The oscillation circuit unit 200 is capable of receiving the electrical signals generated by the echoes formed by the microwaves radiated externally by the radiation sources 20 electrically connected thereto.

Figure 16A:
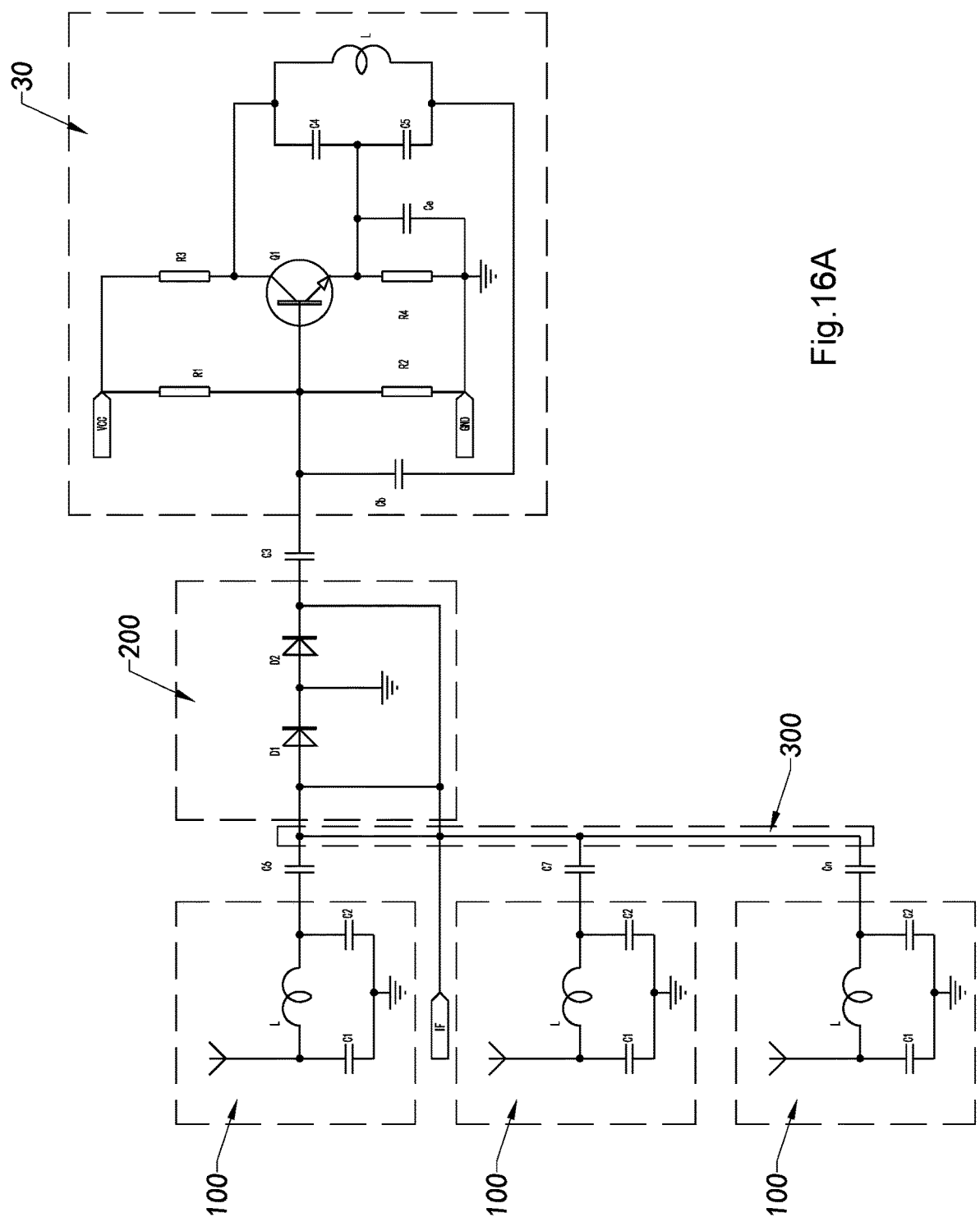
FIG. 16A is a circuit and schematic view of a multiple co-frequency microwaves detection antenna according to another preferred embodiment of the present invention.
Figure 16B:
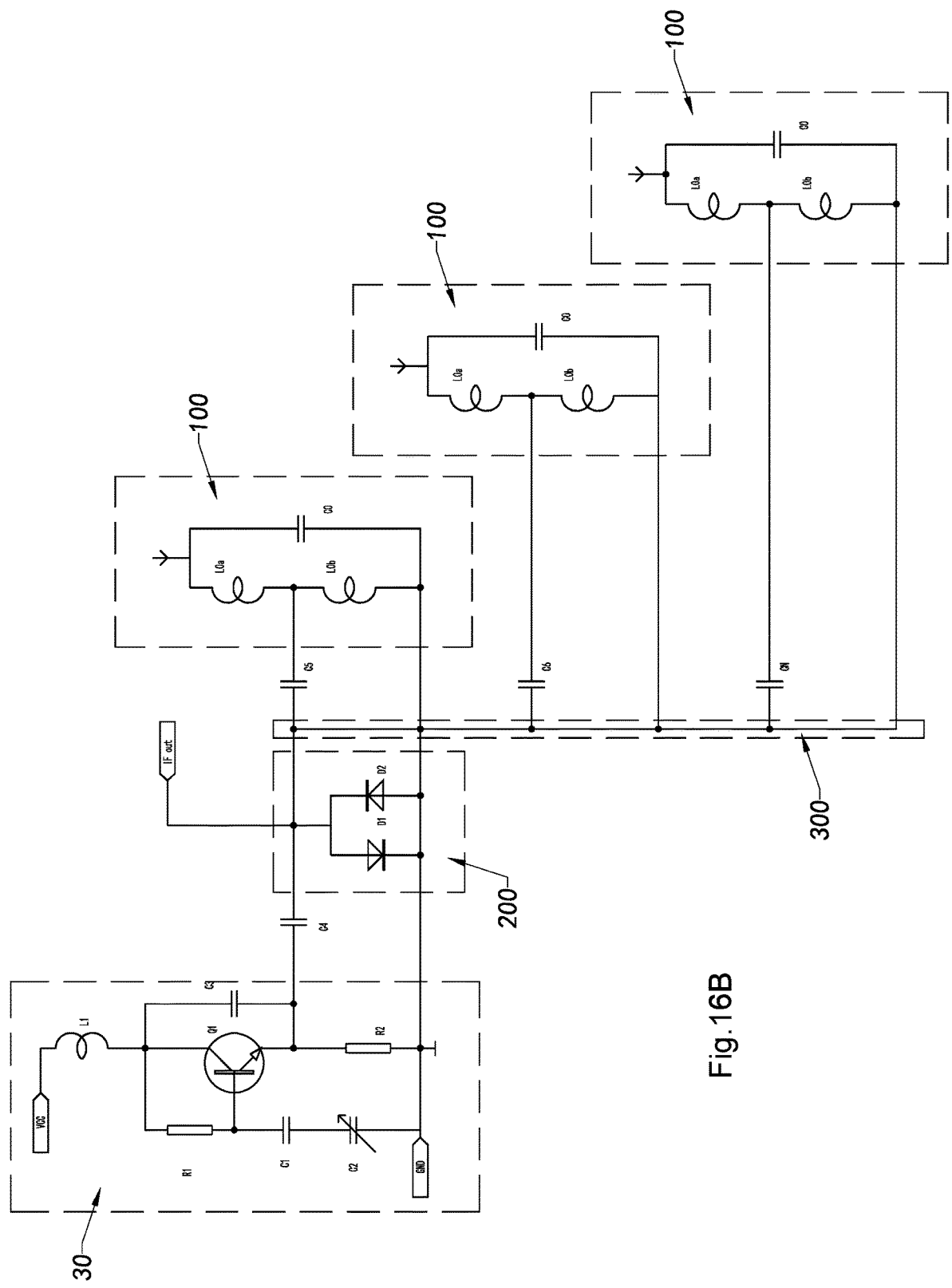
FIG. 16B is a circuit and schematic view of a multiple co-frequency microwaves detection antenna according to another preferred embodiment of the present invention.
Figure 17A:
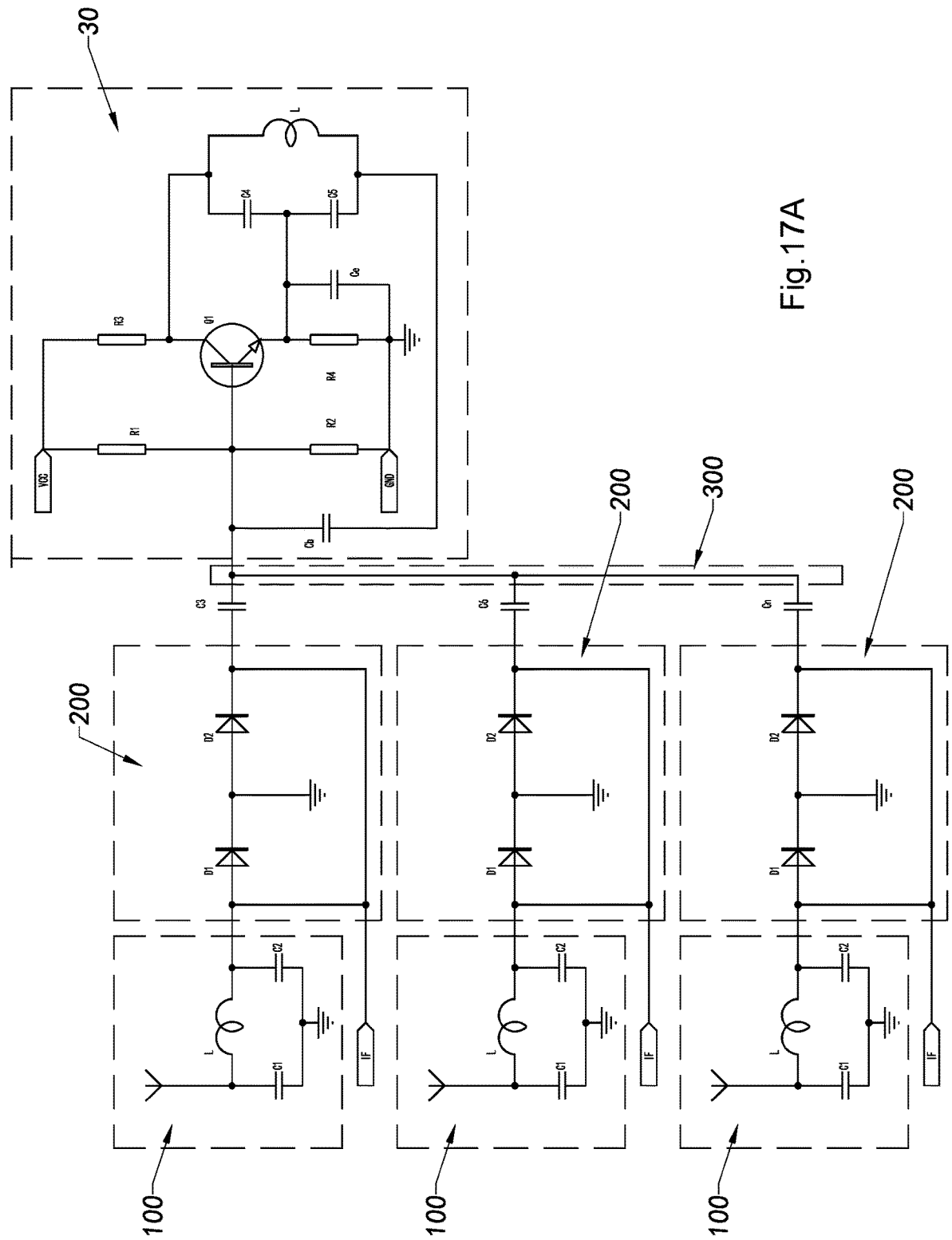
FIG. 17A is a circuit and schematic view of a multiple co-frequency microwaves detection antenna according to another preferred embodiment of the present invention.
Figure 17B:
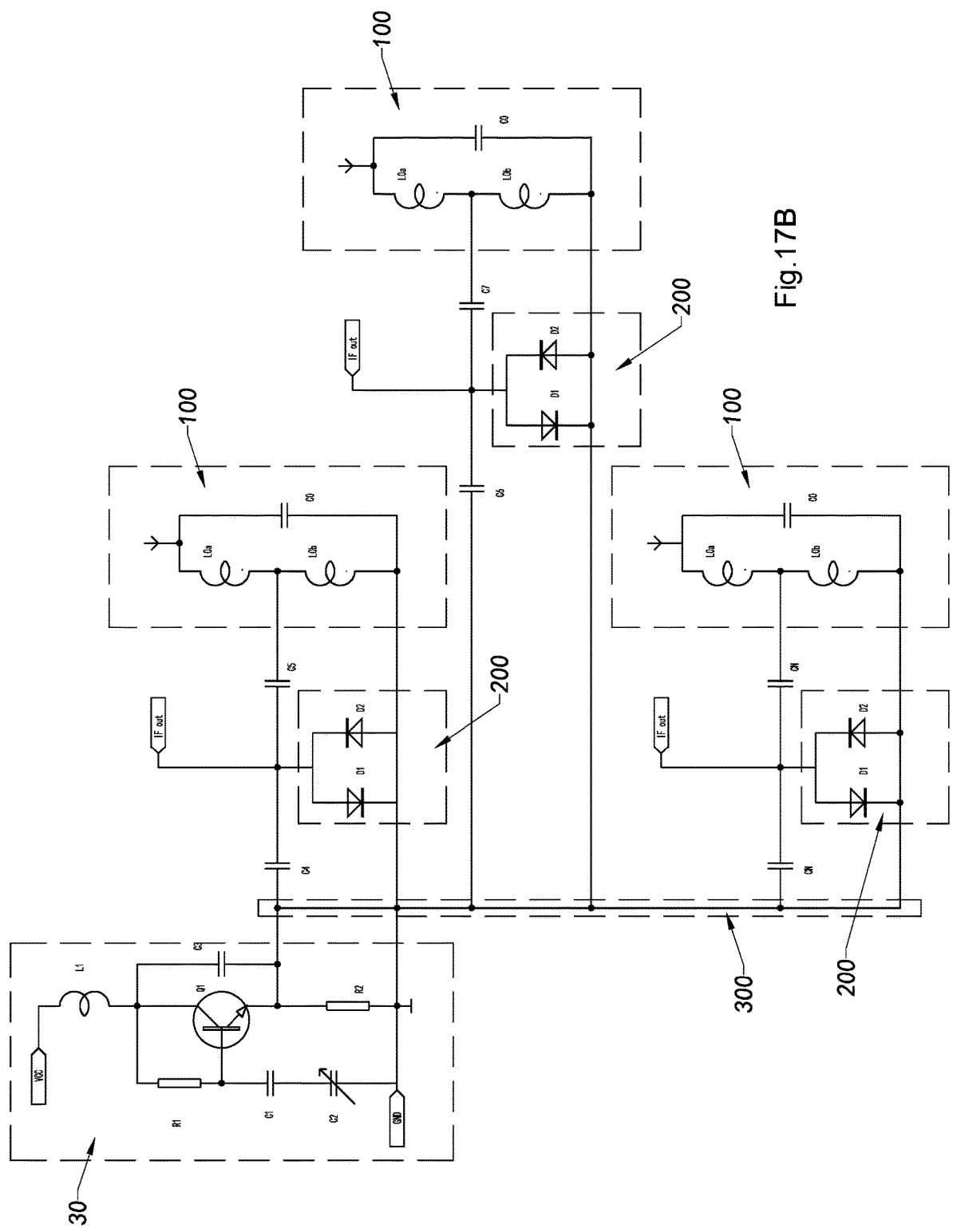
FIG. 17B is a circuit and schematic view of a multiple co-frequency microwaves detection antenna according to another preferred embodiment of the present invention.

Referring to FIG. 16A to FIG. 17B, the antenna further comprises a power splitter 300 to allow a signal to be split into two or multiple outputs or to combine the multiple signals into one output. It should be understood that the signal can be implemented as the electrical signal. Referring to FIG. 16A and FIG. 16B, one end of the power splitter 300 is electrically connected to the mixer and detector circuit 200, and the other end thereof is electrically connected to the feed points 21 of at least two of the radiation sources 20. Referring to FIG. 17A and FIG. 17B, one end of the power splitter 300 is electrically connected to the mixer and detector circuit 200, and the other end thereof is electrically connected to the oscillation circuit unit 30.

For example, referring to FIG. 16A and FIG. 16B, the number of the mixer and detector circuit 200 is implemented as one, and the number of the radiation sources 20 of the antenna is implemented as three. One end of the mixer and detector circuit 200 is electrically connected to the feed points 21 of the three radiation sources 20, and the other end of the mixer and detector circuit 300 is electrically connected to the oscillation circuit unit 30. The three radiation sources 20 of the antenna are capable of generating the three microwaves and detecting the target area from three views. That is, the manner, arranging the different radiation sources 20 at different positions or orientations, will be able to expand the detection area of the antenna to facilitate more accurate determination of the motion state of target objects within the target area. Further, all of the three radiation sources 20 are electrically connected to the oscillation circuit unit 30 such that the frequency of the microwaves externally radiated by the radiation sources 20 are coincided with each other. When the frequency of the echo formed by the microwave generated by each of the three radiation sources 20 is consistent with the frequency of the microwave generated by the corresponding radiation source 20, the electrical signal through the mixer and detector circuit 200 is remained unchanged. That is, the mixer and detector circuit 200 dose not output a differential electric signal with frequency difference or phase difference. When the frequency of the echo formed by the microwave generated by any one of the three radiation sources 20 is changed, the electrical signal through the mixer and detector circuit 200 is also changed, so that the motion state of the object within the target area can be determined based on the change in the electrical signal.

In other embodiments of the invention, the specific number of the mixer and detector circuit 200 is implemented as two or more. It can be determined for the motion state of the object in the target area detected by microwaves generated by at least two of the radiation sources 20 of the antenna according to the changes of the electrical signals of two or more mixer and detector circuits 200. Preferably, both ends of each mixer and detector circuit 200 are respectively electrically connected to the feeding point 21 of the radiation source 20 and the oscillation circuit unit 30. In this way, the target area can be divided into a plurality of sub-areas, and the range of a motion position of the object in the target area can be narrowed by detecting each of the sub-areas, thereby enabling the motion state of the object within the target area to be more accurately determined.

For example, referring to FIG. 17A and FIG. 17B, when the number of the radiation sources 20 of the antenna is implemented as three, the mixer and detector circuit 200 is also implemented as three. The ends of the three mixer and detector circuits 200 are respectively electrically connected to the feeding points 21 of the radiation source 20 of the three analog circuits 100, and the other ends of the three mixer and detector circuits 200 are electrically connected to the oscillation circuit unit 30. The three radiation sources 20 of the antenna are capable of generating three microwaves, and detecting the target area from three views. That is, the manner, arranging the different radiation sources 20 at different positions or orientations, can expand the detection range of the antenna and can divide the target area into at least three sub-areas for detection, so as to determine the motion state of the object in the target area according to electrical signals received by the three mixer and detector circuits 200, and to lock the area in which the object is as well. For example, the moving direction, the moving speed, and the moving trajectory of the target object in the target area can be acquired according to the differential electrical signals output by the three mixing detection circuits 200 according to the received electrical signals.

Specifically, all of the three radiation sources 20 are electrically connected to the oscillation circuit unit 100, and the frequencies of the microwaves radiated externally by the radiation sources 20 are the same. When the frequency of the echo formed by the microwave generated by each of the three radiation sources 20 is consistent with the frequency of the microwave generated by the corresponding radiation source 20, the electrical signal through the mixer and detector circuit 200 is remained unchanged. When the frequency of the echo formed by the microwave generated by any one of the three radiation sources 20 is changed, the electrical signal through the mixer and detector circuit 200 electrically connected to the radiation source 20 is also changed, so that the motion state of the object within the target area can be determined. Further, due to the mixer and detector circuits 200 in one-to-one correspondence with the radiation sources 20, it can be further determined in which diction area detected by the microwave formed by the radiation source 20 the object in the target region is moving to further locate the range of the area in which the moving object is.

More specifically, when three microwaves generated by the three radiation sources 20 of the antenna form three radiation areas, and the three radiation areas can divide the target area into five sub-regions, once the electrical signal of one of the three mixer and detector circuits 200 through the three mixer and detector circuits 200 is changed, it can be determined that the object is moving within the radiation areas formed by the microwaves generated by the radiation sources 20 electrically connected to the mixer and detector circuit 200. Once the electrical signals of the mixer and detector circuits 200 through two of the three mixer and detector circuits 200 are changed, it can be determined that the object is moving within the overlapped area of the radiation areas formed by the microwaves generated by the two mixer and detector circuits 200 which are respectively electrically connected to the two mixer and detector circuits 200. In this way, not only the motion state of the object in the target area but also the number and the distribution of the moving object can be determined more accurately, and the motion trajectory of the moving object can be judged based on the change in the distribution of the moving object.

Further, when a fluctuation signal corresponding to breathing or heartbeat of a human body is extracted from the differential electrical signal output by the mixer and detector circuit 200 to determine weather the moving object in the target region is a human (live) body according to the fluctuation signal, the number and distribution of the moving objects are the number and distribution of human (live) bodies in the target area, and the breathing or heartbeat of the human (live) body in the target area can be monitored by the antenna.

In particular, when the three microwaves generated by the three radiation sources 20 of the antenna cover a layered radiation area in a vertical direction, such as covering independently three layers of radiation areas separated into vertical directions by or overlapply covering four or five layers of radiation separated into vertical directions. By detecting the human body between different layers, the posture of the detected human body can be determined. For example, when the human body is detected in the three layers of radiation, the posture of the detected human body should be determined as a standing posture. When the human body is detected in only two layers of radiation areas that are subordinated in the vertical direction, the posture of the detected human body should be determined as a sitting posture. When the human body is only detected in the lowest radiation area in the vertical direction, the posture of the detected human body should be determined as a lying posture.

Further, when both ends of each of the mixer and detector circuits 200 are respectively connected to the feeding point 21 of one of the radiation source 20 and the oscillation circuit unit 30, the corresponding detection signals of each of the radiation sources 20 may be processed and defined differently to implement different functions and applications to improve the applicability of the antenna. For example, the antenna is used to detect an activity state of the user in a room. The plurality of radiation sources 20 of the antenna can be arranged to detect the activity state of the user in different areas by respectively facing different directions, and to further provide related functions and services corresponding to different regions and activity states to the user according to the activity state of the user and the region, such as illumination according to need, air conditioning according to the user state and location, etc. One of the radiation sources 20 is arranged to face toward the bed in the room to detect whether the user is in a sleep state or an active state in another region. And further, by amplifying and filtering the differential electrical signal outputted by the mixer and detector circuit 200 electrically connected with the radiation source 20, a fretting motion of the user's breathing or heartbeat can be detected to determine whether the user exists in the room or the activity state in the target area. As in the above-described layered detection manner, based on detecting that the user is in the lying posture, whether the user has gone to sleep can be further determined by detecting the breathing or heartbeat state of the user in the lying posture to be able to intelligently activate the functions and services to a corresponding scene mode, thereby improving the applicability of the antenna.

In particular, in view of the fact that the microwaves cannot be visually recognized by the human eye, in order to improve the convenience and accuracy of the installation and debugging of the multiple co-frequency microwaves detection antenna, a photoelectric indicating device can be arranged at the radiation direction of each of the radiation sources 20 or the radiation sources combination to determine the different radiation and coverage area and extent of the microwave corresponding to the radiation sources 20 and the combination of the radiation sources 20, when the multiple co-frequency microwaves detection antenna is installed and debugged.

It should be understood by those skilled in the art that the applications of the antenna of the present invention are exemplified for better understanding and elaboration of the present invention, wherein different application modes and scenes of the antenna can be combined with each other. For example, while detecting the posture of the human body, the breathing or heartbeat of the human body in a sleeping position can be monitored. For example, based on the number and distribution of the human bodies detected, combined with the posture detection of the human body, or further combined with breathing and/or heartbeat detection of the human body, it can judge the activity of the person or the group of the person, such as dinner, entertainment, meetings and other scenarios. Different applications can be combined with each other to form the antenna of the present invention, and the present invention is not exemplified.

It should be understood that in other embodiments of the present invention, the number of the mixer and detector circuits 200 may be implemented as two or more, and the specific number of the mixer and detector circuits 200 can be inconsistent with the number of the radiation source 20. In other words, the mixer and detector circuits 200 and the radiation sources 20 are not in one-to-one correspondence. For example, the number of the radiation sources 20 is embodied as four, and the number of the analog circuits 100 is embodied as four, but the number of the mixer and detector circuits 200 is embodied as two. One end of one of the mixer and detector circuits 200 is electrically connected to two analog circuits 100, the other end thereof is electrically connected to the oscillation circuit unit 30. That is, one of the mixer and detector circuits 200 is arranged to correspond to two radiation sources 20. The electrical signal which is formed by the echo corresponding to the microwave generated by the radiation source 20 and is received by the mixer and detector circuit 200 can be used to determine the motion state of the object in the target area in the radiation area formed by the microwave generated by the radiation source 20. In this way, the detection area of the antenna can also be enlarged in such a manner and the detection efficiency of the antenna can be improved.

Preferably, referring to FIG. 17A and FIG. 17B, in some embodiments of the present invention, the oscillation circuit unit 30 is implemented as a low impedance and oscillating circuit. Correspondingly, the radiation sources 20 of the antenna can be grounded, and a grounding point of the antenna 20 to which the radiation source 20 is grounded and a feeding point 21 of the radiation source 20 can have an inductance characteristic and have a preset impedance, so that the impedance of the antenna is lowered and a bandwidth is further narrowed when the antenna receives and radiates the microwaves to facilitate reducing the interference of microwaves radiated and received by the antenna from microwaves in adjacent bands. That is, the oscillation circuit unit 30 has low impedance and the oscillation circuit unit 30 can provide the antenna with an excitation current that matches the low impedance of the antenna, so that the antenna can generate an initial polarization direction and radiates the microwaves. Further, two ends of the mixer and detector circuit 200 are respectively electrically connected between the radiation source 20 and the oscillation circuit unit 30. Due to an output with low impedance of the mixer and detector circuit 200 adapted to the oscillation circuit unit 30 and the low impedance of the antenna to ground, the stability and the reliability of the antenna performing can be ensured. It should be understood by those skilled in the art that the specific embodiment of the oscillation circuit unit 30 is merely an example and should not be considered as a limitation on the content and scope of the antenna of the present invention.

According to an aspect of the present invention, the present invention further provides a manufacture method of the multiple co-frequency microwaves detection antenna, wherein the manufacture method comprises the following steps:

(a) Maintain at least two of the radiation sources 20 at the first side 51 of the reference ground 10 in a manner that at least one radiation gap 40 is formed between at least two radiation sources 20 and the reference ground 10.

(b) Electrically connect the feed points 21 of the radiation sources 20 to the oscillation circuit unit 30.

The above manufacture method further comprises a step (c):

Set the reference ground 10 to the substrate 50. Specifically, the reference ground 10 may be held on one side of the substrate 50 by being attached to the first side 51 of the substrate 50. Further, the substrate 50 has a predetermined flexibility and the substrate 50 can be deformed to change the extension direction of the reference ground 10 held at one side of the substrate 50. Preferably, the substrate 50 is an flexible deformable PCB board and at least a portion of the substrate 50 can be bent.

The manufacture method further comprises a step (d):

Arrange the oscillation circuit unit 30 at the substrate 50. Preferably, the oscillation circuit unit 30 is embedded in the substrate 50. Preferably, the oscillation circuit unit 30 is mounted on one side of the substrate 50.

Preferably, after the step (b), the manufacture method further comprises a step (e):

Provide at least one of the reflectors 70 at the reference ground 10, wherein the reflective surface 71 of the reflector 70 is arranged to face the radiation source 20 and an angle can be formed between the reflective surface 71 thereof and the radiation source 20, wherein the reflective surface 71 of the reflector 70 can reflect and constraint the microwave outwardly radiated by the radiation source 20. Preferably, the reflector 70 is movably disposed at the reference ground 10. By dynamically adjusting the angle formed between the reflective surface 71 of the reflector 70 and the radiation source 20, the detection area covered by the microwaves can be dynamically changed. Preferably, the reflector 70 is made of copper, copper alloy or other metal.

Preferably, in the above manufacture method, the manufacture method further comprises a step of:

detachably mounting the flexible connectors 80 to the first substrate 501 of the substrate 50 and detachably mounting the second substrates 502 to the flexible connectors 80, such that the second substrates 502 are detachably extended from the first substrate 501.

According to another aspect of the present invention, the present invention further provides a detection method of the multiple co-frequency microwaves detection antenna, wherein the detection method comprises the following steps:

(I) Radiate outwardly the microwaves having the same frequencies by means of connecting the feed points 21 of at least two radiation sources 20 to the oscillation circuit unit 30.

(II) Dynamically change the radiation direction or radiation angle of the microwave radiated by the radiation source 20.

Preferably, in the step (II), the detection method further comprises a step (III):

Change the extension direction of the reference ground 10 disposed at the substrate 50 in a manner of changing the extension direction of the substrate 50 to change the position of at least one of the radiation source 20 in relative to the other radiation source 20 to change the radiation direction of the microwave generated by the radiation source 20. Specifically, the substrate 50 is deformed such that the extension direction of at least a portion of the substrate 50 is changed, thereby changing the extension direction of the corresponding reference ground body 11 so as to the position of the radiation source 20 held on one side of the reference ground body 11 relative to the other radiation sources 20 is varied to dynamically adjust the detection area of the multiple co-frequency microwaves detection antenna.

Preferably, in the step (II), the detection method further comprises a step (IV):

Reflect or constraint the microwave by the reflective surface 71 of the reflector 70. Further, the angle can be dynamically adjusted between the reflective surface 71 of the reflector 70 and the radiation source 20. And, the microwaves generated by the radiation sources 20 can be reflected or constrained in one or more directions to form the detection area.

Preferably, in the step (II), the detection method further comprises a step of:

cooperating the reflector 70 and the substrate 50 to change the radiation direction and the radiation angle of the microwave generated by the corresponding radiation source 20.

Preferably, in the step (II), the detection method further comprises a step of:

changing the extension direction of the flexible connector 80 connecting the first substrate 501 to the second substrate 502 to change the position of at least one of the radiation source 20 relative to the other radiation sources 20, to change the radiation direction of the microwave generated by the radiation source 20 to adjust the detection area of the antenna. Preferably, the flexible connector 80 and the reflector 70 are cooperated to change the radiation direction and the radiation angle of the microwave generated by the corresponding radiation source 20.

According to a preferred embodiment of the present invention, after the step (I), the detection method further comprises a step (ii):

Receive the electrical signal formed by the echo corresponding to the microwave which is correspondingly generated by at least one of the radiation sources 20 by at least one of the mixer and detector circuits 200.

Preferably, in the step (ii), each of the mixer and detector circuits 200 receives the electrical signal formed by the echo of the microwave generated by one of the radiation source 20. Via the changes of the electrical signal through the mixing detection circuit 200, it can be determined for the motion state of the object in the target area corresponding to the microwave generated by the corresponding radiation source 20 of the multiple co-frequency microwaves detection antenna.

Preferably, in the step (ii), each of the mixing detection circuits receives the electrical signals formed by the echoes generated by two or more radiation sources 20. By the changes of electrical signals through the mixing detection circuits 200, it can be determined for the motion state of the object in the target area corresponding to the microwaves generated by the at least two corresponding radiation sources 20 of the multiple co-frequency microwaves detection antenna.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A multiple co-frequency microwaves detection antenna, comprising:
    an oscillation circuit unit;
    a reference ground;
    at least two radiation sources, wherein each of said at least two radiation sources has a feed point, wherein said at least two radiation sources are spacedly arranged at said reference ground, and a radiation gap is formed between each of said at least two radiation sources and said reference ground, wherein said feed points of said at least two radiation sources are electrically connected to said oscillation circuit unit; and at least one mixer and detector circuit, wherein both ends of said at least one mixer and detector circuit are electrically connected to said oscillation circuit unit and said feeding point of each of said at least two radiation sources respectively, wherein one end of each of said at least one mixer and detector circuit is electrically connected to said feed point of one of said at least two radiation sources, and the other end of each of said at least one mixer and detector circuit is electrically connected to said oscillation circuit unit.

2. A multiple co-frequency microwaves detection antenna, comprising:

an oscillation circuit unit;

a reference ground;

at least two radiation sources, wherein each of said at least two radiation sources has a feed point, wherein said at least two radiation sources are spacedly arranged at said reference ground, and a radiation gap is formed between each of said at least two radiation sources and said reference ground, wherein said feed points of said at least two radiation sources are electrically connected to said oscillation circuit unit; and at least one mixer and detector circuit, wherein both ends of said at least one mixer and detector circuit are electrically connected to said oscillation circuit unit and said feeding point of each of said at least two radiation sources respectively, wherein one end of each of said at least one mixer and detector circuit is electrically connected to said feeding points of said at least two radiation sources, and the other end of each of said at least one mixer and detector circuit is electrically connected to said oscillation circuit unit.

3. The multiple co-frequency microwaves detection antenna, as recited in claim 2, wherein said at least two radiation sources of said multiple co-frequency microwaves detection antenna are grounded.

* * * * *